United States Patent
Wang et al.

(10) Patent No.: US 10,891,189 B2
(45) Date of Patent: Jan. 12, 2021

(54) CUSTOMIZED PARAMETERIZATION OF READ PARAMETERS AFTER A DECODING FAILURE FOR SOLID STATE STORAGE DEVICES

(71) Applicant: Seagate Technology LLC, Cupertino, CA (US)

(72) Inventors: Zheng Wang, Louisville, CO (US); Ara Patapoutian, Hopkinton, MA (US); Bengt Anders Ulriksson, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 16/259,346

(22) Filed: Jan. 28, 2019

(65) Prior Publication Data

US 2020/0241959 A1  Jul. 30, 2020

(51) Int. Cl.
*H03M 13/11* (2006.01)
*G06F 11/10* (2006.01)
*G11C 11/56* (2006.01)
*G06F 11/00* (2006.01)

(52) U.S. Cl.
CPC ........ *G06F 11/1068* (2013.01); *G06F 11/008* (2013.01); *G11C 11/5642* (2013.01); *H03M 13/1111* (2013.01)

(58) Field of Classification Search
CPC .............. G06F 11/1068; G06F 11/008; H03M 13/1111; G11C 11/5642
USPC ........................................................ 714/758
See application file for complete search history.

(56) References Cited

U.S. PATENT DOCUMENTS

| | | | |
|---|---|---|---|
| 8,531,888 B2 | 9/2013 | Chilappagari et al. | |
| 8,797,805 B2 | 8/2014 | Shen | |
| 8,856,611 B2 | 10/2014 | Wu et al. | |
| 8,953,373 B1 | 2/2015 | Wu et al. | |
| 9,153,336 B1 * | 10/2015 | Yang | G11C 16/26 |
| 9,236,099 B2 | 1/2016 | Alhussien et al. | |
| 9,455,004 B2 | 9/2016 | Alhussien et al. | |
| 9,799,405 B1 * | 10/2017 | Micheloni | G11C 29/52 |
| 10,659,084 B1 * | 5/2020 | Sandell | H03M 13/6577 |
| 2011/0205823 A1 * | 8/2011 | Hemink | G11C 7/04 |
| | | | 365/211 |
| 2014/0289450 A1 * | 9/2014 | Wu | H03M 13/45 |
| | | | 711/103 |

(Continued)

*Primary Examiner* — Albert Decady
*Assistant Examiner* — Enam Ahmed
(74) *Attorney, Agent, or Firm* — Taylor English Duma LLP

(57) ABSTRACT

Read parameter estimation techniques are provided that obtain information from multiple read operations to customize read parameters for data recovery. One method comprises performing the following steps, in response to a decoding failure of a page of a memory or a codeword of the memory: obtaining at least three read values of the page or codeword; and processing the at least three read values to determine read parameters comprising: (i) a log likelihood ratio, and/or (ii) a center read reference voltage, wherein the determination is based on a signal count of a number of bits falling in particular regions of multiple regions of the memory and wherein the determined read parameters are used for a decoding of the page or codeword following the decoding failure and/or a subsequent read operation following a successful decoding of the page or codeword.

11 Claims, 20 Drawing Sheets

(56) References Cited

U.S. PATENT DOCUMENTS

| | | | |
|---|---|---|---|
| 2015/0135031 A1* | 5/2015 | Cohen | G11C 29/52 714/758 |
| 2016/0049203 A1* | 2/2016 | Alrod | G11C 16/26 714/2 |
| 2018/0159560 A1* | 6/2018 | Sharon | G06F 3/0619 |
| 2019/0324853 A1* | 10/2019 | Barndt | G06F 11/1004 |
| 2020/0177209 A1* | 6/2020 | Ismail | H03M 13/6325 |

* cited by examiner

| Region | A | B | C | D |
|---|---|---|---|---|
| Reading $[T_l T_c T_r]$ | 111 | 011 | 001 | 000 |
| LLR value | -7 | -2 | 2 | 7 |

|          | LLR(A) | LLR(B) | LLR(C) | LLR(D) |
|----------|--------|--------|--------|--------|
| LLR LUT 1 | -7 | -2 | 2 | 7 |
| LLR LUT 2 | -7 | -3 | 2 | 7 |
| ...       | ... | ... | ... | ... |
| LLR LUT N | -7 | -5 | 1 | 7 |

CUSTOMIZED PARAMETERIZATION OF READ PARAMETERS AFTER A DECODING FAILURE FOR SOLID STATE STORAGE DEVICES

SUMMARY

In one embodiment, a method comprises performing the following steps, in response to a decoding failure of one or more of a page of a memory and a codeword of the memory: obtaining at least three read values of the one or more of the page and the codeword; and processing the at least three read values to determine one or more read parameters comprising one or more of: (i) at least one log likelihood ratio, and (ii) at least one center read reference voltage, wherein the determination is based on a signal count of a number of bits falling in particular regions of a plurality of regions of the memory and wherein the one or more determined read parameters are used for one more of a decoding of the page and the codeword following the decoding failure and a subsequent read operation following a successful decoding of the one or more of the page and the codeword.

In some embodiments, the signal counts indicate a location of a current center reference voltage with respect to a substantially optimum center reference voltage. In one or more embodiments, the step of processing the at least three read values, or a portion thereof, is performed using a hardware acceleration block, firmware, a state machine and/or hardware.

Other illustrative embodiments include, without limitation, apparatus, systems, controllers, methods and computer program products comprising processor-readable storage media.

BRIEF DESCRIPTION OF THE DRAWINGS

FIG. 6 illustrates an example of a multiple LLR LUT, according to one embodiment of the disclosure;

DETAILED DESCRIPTION

Illustrative embodiments will be described herein with reference to exemplary solid state storage devices and associated storage media, controllers, and other processing devices. It is to be appreciated, however, that these and other embodiments are not restricted to the particular illustrative system and device configurations shown. Accordingly, the term "solid state storage device" as used herein is intended to be broadly construed, so as to encompass, for example, any storage device implementing the read parameter prediction techniques described herein. Numerous other types of storage systems are also encompassed by the term "solid state storage device" as that term is broadly used herein.

In one or more embodiments, read parameter estimation techniques are provided that obtain additional information from existing multiple read operations to customize one or more read parameters for data recovery. In some embodiments, exemplary error recovery techniques are provided that process three or more read values of a given codeword or page to determine read parameters comprising (i) LLRs, and/or (ii) center $V_{ref}$, as discussed further below.

Figure 1:
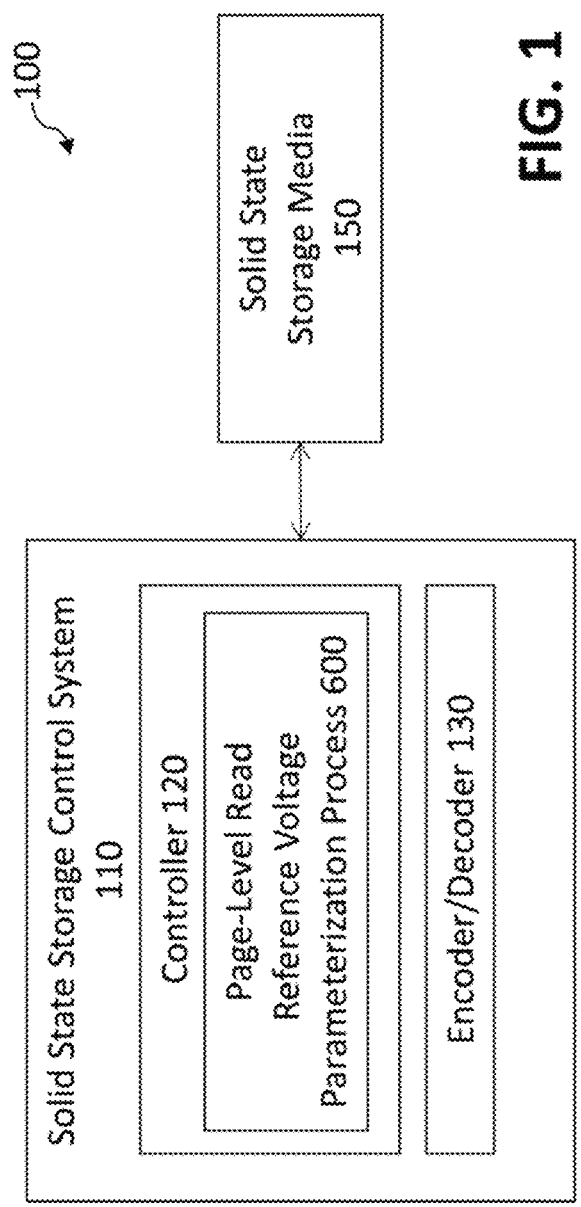
FIG. 1 is a schematic block diagram of an illustrative solid state storage system, in accordance with one or more embodiments of the present disclosure.

FIG. 1 is a schematic block diagram of an illustrative solid state storage system 100. As shown in FIG. 1, the illustrative solid state memory system 100 comprises a solid state storage control system 110 and a solid state storage media 150. The exemplary solid state storage control system 110 comprises a controller 120 and an encoder/decoder block 130. In an alternative embodiment, the encoder/decoder block 130 may be implemented inside the controller 120.

As shown in FIG. 1, the controller 120 comprises a page-level read reference voltage parameterization process 600, discussed below in conjunction with FIGS. 6A and 6B, to implement the read parameter prediction techniques described herein. The encoder/decoder block 130 may be implemented, for example, using well-known commercially available techniques and/or products. The encoder within the encoder/decoder block 130 may implement, for example, error correction encoding, such as a low-density parity-check (LDPC) encoding. The decoder within the encoder/decoder block 130 may be embodied, for example, as a hard decision decoder, such as a hard decision low-density parity-check (HLDPC) decoder.

The solid state storage media 150 comprises a memory array, such as a single-level or multi-level cell flash memory, a NAND flash memory, a phase-change memory (PCM), a magneto-resistive random access memory (MRAM), a nano RAM (NRAM), a NOR (Not OR) flash memory, a dynamic RAM (DRAM) or another non-volatile memory (NVM). While the disclosure is illustrated primarily in the context of a solid state storage device (SSD), the disclosed read parameter prediction techniques can be applied in solid state hybrid drives (SSHD) and other storage devices, as would be apparent to a person of ordinary skill in the art based on the present disclosure.

Figure 2:
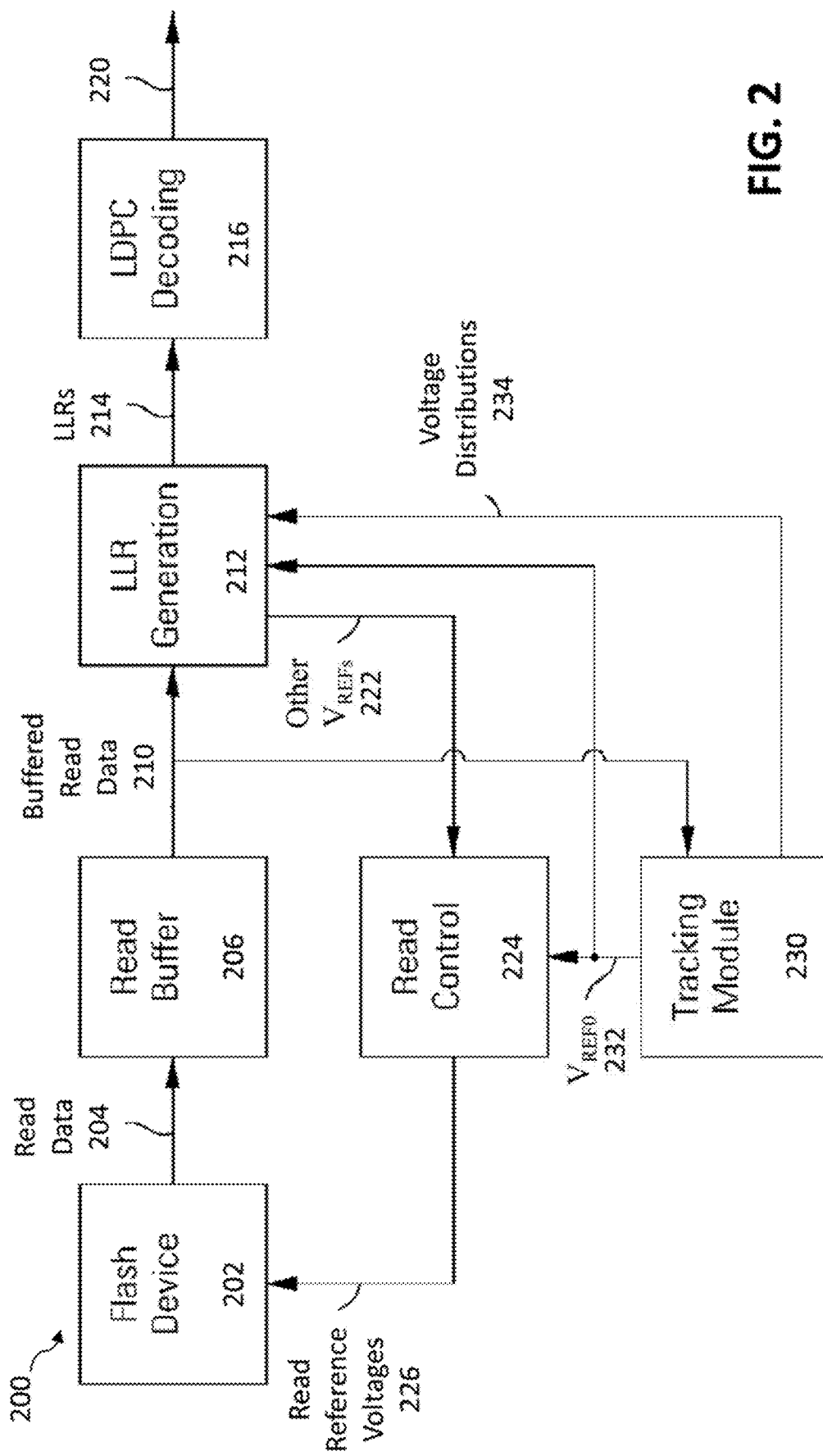
FIG. 2 illustrates a flash channel read path with read reference voltage tracking, in accordance with some embodiments of the present disclosure.

FIG. 2 illustrates a flash channel read path 200 with channel tracking-based read retry voltage adjustment in accordance with some embodiments of the present disclosure. The read path 200 includes a flash device 202 having an array of memory cells, or another type of non-volatile memory. Based upon the disclosure provided herein, one of ordinary skill in the art will recognize a variety of storage technologies that can benefit from the read parameter prediction techniques disclosed herein.

Read reference voltages 226 are applied to the flash device 202 by a read control device 224 in a series of N reads. Each memory cell is read N times, and the N reads result in read data 204 containing N bits per memory cell as a quantized version of the stored voltage on the memory cell. The read data 204 is buffered in a read buffer 206, and buffered read data 210 from read buffer 206 is provided to a log likelihood ratio (LLR) generation circuit 212 (or likelihood generator, which can also be adapted to use plain likelihood values). The N bits for a memory cell are mapped to log likelihood ratios 214 for the memory cell in log likelihood ratio generation circuit 212. In some embodiments, the log likelihood ratio generation circuit 212 contains a lookup table that maps the read patterns in buffered read data 210 to log likelihood ratios 214.

A tracking module 230 receives the buffered read data 210 from the read buffer 206, or from any other suitable source. Generally, channel tracking techniques adapt to the changes in read reference voltages to maintain a desired performance level. Adaptive tracking algorithms typically track variations in the solid state storage channel and consequently, help to maintain a set of updated channel parameters. The updated channel parameters are used, for example, to adjust read reference voltages. United States Published Patent Application No. 2013/0343131, filed Jun. 26, 2012, entitled "Fast Tracking for Flash Channels," and/or United States Published Patent Application No. 2015/0287453, entitled "Optimization of Read Thresholds for Non-Volatile Memory," (now U.S. Pat. No. 9,595,320) incorporated by reference herein in their entirety, disclose techniques for adapting read reference voltages.

The tracking module 230 identifies the intersection point between neighboring voltage distributions for a memory cell, in a known manner, and provides read reference voltage level $V_{REF0}$ 232, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation, and additional read reference voltages around $V_{REF0}$ to obtain substantially all possible log likelihood ratio values. The tracking module 230 thus generates the read reference voltage level $V_{REF0}$ 232 to be used in read retry operations. In other embodiments, $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 212 and 224.

The tracking module 230 also tracks the voltage distributions 234. In some embodiments, the tracking module 230 calculates the voltage distribution means and variances for each voltage distribution 234 corresponding to each possible state in each memory cell. The voltage distributions 234 can be calculated in any suitable manner based on the read data. As an example, the tracking module 230 can operate as disclosed in U.S. Published Patent Application No. 2013/0343131, filed Jun. 26, 2012, entitled "Fast Tracking for Flash Channels," incorporated by reference herein in its entirety. In some embodiments, the tracking module 230 tracks intersections without estimating means or variances.

For a two-state memory cell, or single-level memory cell, the tracking module 230 estimates the means and variances of the voltage distributions of states "1" and "0", as well as the read reference voltage $V_{REF0}$ that most reduces the bit error rate and which likely lies at the intersection of those distributions, in a known manner.

The tracking module 230 provides the voltage distributions 234 to the log likelihood ratio generation circuit 212 for use in updating the log likelihood ratio lookup table. The log likelihood ratio generation circuit 212 is used to calculate likelihood values 214 for decoding by an LDPC (low-density parity-check) decoder 216 that generates decoded data 220. The log likelihood ratio generation circuit 212 also determines where to place the other N−1 read reference voltages around $V_{REF0}$ 232 based on the voltage distributions 234 and on the read reference voltage $V_{REF0}$ 232 to obtain substantially all possible log likelihood ratio values when the read patterns in buffered read data 210 are mapped to log likelihood ratios. The log likelihood ratio generation circuit 212 determines where to place the other N−1 read reference voltages around $V_{REF0}$ 232, updates the lookup table, and provides the N−1 read reference voltage levels 222 to a read controller 224. It is important to note that the division of functionality is not limited to the example embodiments disclosed herein. For example, in other embodiments, the tracking module 230 calculates and provides read reference voltages around $V_{REF0}$ 232 and provides those voltages to the log likelihood ratio generation circuit 212, rather than the log likelihood ratio generation circuit 212 determining where to place the other N−1 read reference voltages around $V_{REF0}$ 232, and these divisions of functionality are to be seen as equivalent.

The read reference voltages are stored in log likelihood ratio generation circuit 212 in some embodiments, as calculated based on the log likelihood ratio lookup table in log likelihood ratio generation circuit 212 and on the voltage distribution means and variances 234 from tracking module 230.

The read controller 224 controls read retry operations in the flash device 202, providing each of the N read reference voltages (including $V_{REF0}$ 232) to be used when reading the memory cells in the flash device 202. The read controller 224 initiates N reads of a page, with the first read using read reference voltage $V_{REF0}$ in some embodiments, and with the subsequent N−1 reads at read reference voltages around $V_{REF0}$ as determined by log likelihood ratio generation circuit 212.

Figure 3:
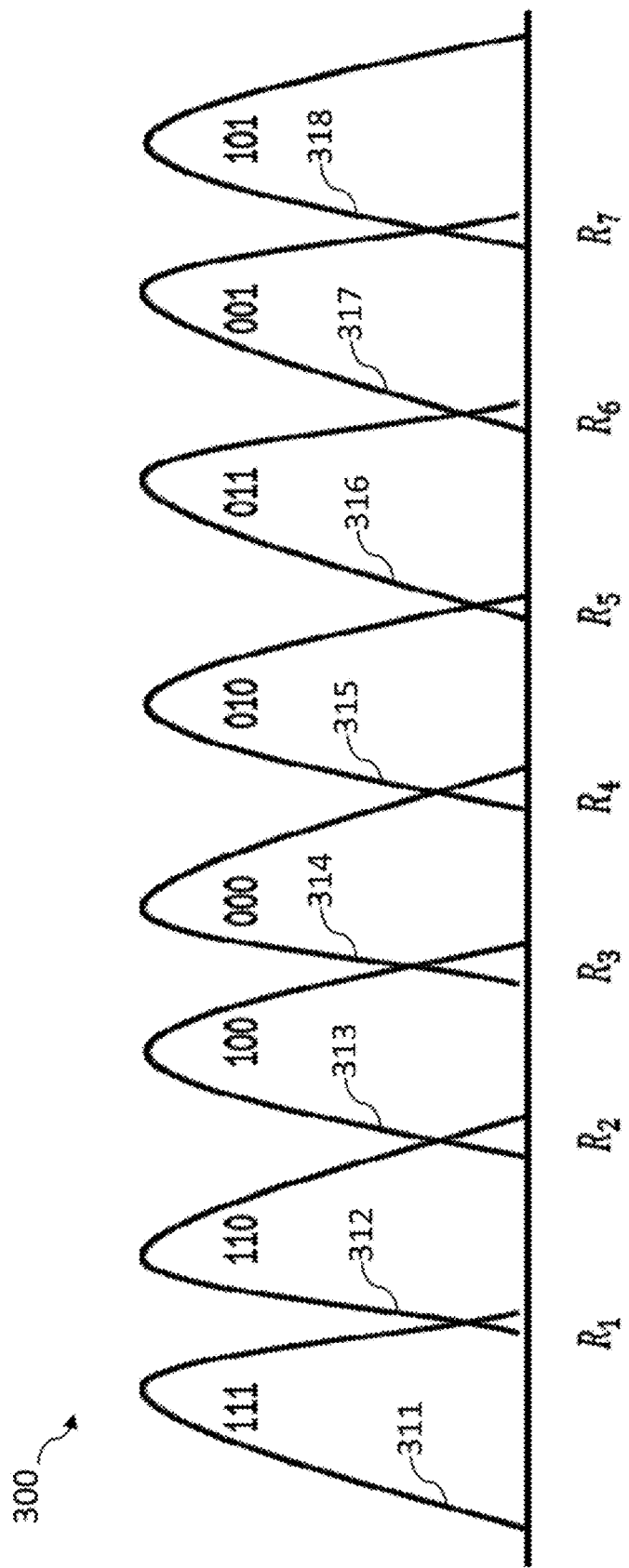
FIG. 3 is a graph of cell voltage distributions for a normal hard decision read operation in a solid state memory device, in accordance with some embodiments of the present disclosure.

FIG. 3 is a graph 300 of cell voltage distributions 311 through 318 for a normal hard decision read operation in a TLC flash memory device, in accordance with some embodiments of the present disclosure. The exemplary TLC flash memory device is a BiCS3 NAND flash memory from Toshiba Memory America, Inc. The resulting voltages read from the memory cell thus appear something like the distributions 311-318 shown in the graph 300 of FIG. 3, rather than eight distinct discrete voltage levels corresponding to the eight states 111, 110, 100, 000, 010, 011, 001, 101 at the corresponding target state voltage levels. Each distribution 311-318 will have a mean roughly equal to the target voltage for the respective state, and the variance will depend upon the noise. Because the voltages on the memory cell are not accurate, the voltages read back can vary according to the distributions 311-318. In some embodiments, during the initial read of the memory cell, reference voltages $R_i$ (i=1, 2, ..., 7) (e.g., $R_1$ through $R_7$) are used during a read to determine the state of the memory cell, returning hard decisions about the state of the memory cell.

For example, in general, if the read voltage is below reference voltage $R_1$, a decision indicates that the memory cell is determined to be in state 111. If the read voltage is above reference voltage $R_1$ and below reference voltage $R_2$, a decision indicates that the memory cell is determined to be in state 110, and so on.

The first, second, and third bits in a given state are often referred to as the most-significant bits, center-significant bits, and least-significant bits (MSB, CSB, LSB), respectively. In some embodiments, the read operation is divided into a process of reading least significant bit (LSB) pages, center significant bit (CSB) pages and most significant bit (MSB) pages. States 111, 011, 001 and 101, for example, correspond to a least significant bit value of 1, and states 110, 100, 000 and 101 correspond to a least significant bit value of 0. When reading the least significant bit, for example, the reference voltages $R_1$ and $R_5$ are applied to the memory cell to obtain the least significant bit.

While FIG. 3 illustrates the cell voltage distributions for a TLC flash memory, the disclosed read parameter prediction techniques can be applied to SLC, MLC, QLC, etc. and other flash memory systems, as would be apparent to a person of ordinary skill in the art.

For each $R_i$ shown in FIG. 3, a pair $(V_{oi}, P_i)$ can be derived for each page number, where $V_{oi}$ is the substantially optimal reference voltage that substantially minimizes the bit error rate, and $P_i$ is the corresponding page number.

Read Parameter Prediction Techniques

In one or more embodiments, techniques are provided for read parameter prediction using three or more read operations of a solid state storage device, such as a flash memory. In flash memory systems, a single-read produces hard information (such as bit estimation of "0" or "1"). If hard information is not sufficient to recover the data, additional read operations are usually issued to generate soft information for a decoding process. The way the soft information is generated from multiple read operations has a direct impact on the error recovery performance. The present disclosure discloses efficient methods where read parameters, such as an LLR and center voltage reference ($V_{ref}$) are predicted from three initial read operations. The predicted LLR provides more accurate soft information for an error correction decoder (such as an LDPC decoder); while the estimated center $V_{ref}$ is expected to reduce the raw bit error count. In either case, the error recovery performance is improved.

Multiple Read operations in Flash Memory

Figures 4, 5:
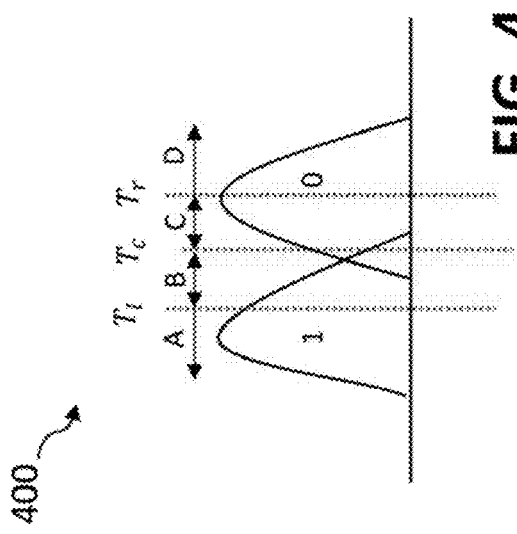
FIG. 4 illustrates an example of three read operations for an exemplary flash memory device, according to some embodiments.
FIG. 5 illustrates an example of a log likelihood ratio (LLR) lookup table (LUT), according to an embodiment of the disclosure.

For an initial error recovery process in a flash memory, a single-read operation is typically issued, and the hard information is mapped into log LLR values that are passed to error correction decoder to recover the data. If the decoder fails to decode, then additional read operations are issued (in some cases, more single-read operations with different reference voltage values are issued before multiple read operations.). FIG. 4 illustrates an example 400 of three read operations for an SLC device, according to some embodiments, where a center read operation (denoted by $T_C$) and two shoulder read operations (denoted by $T_l$ and $T_r$) are issued. The three read operations yield four regions, denoted in FIG. 4 by regions A, B, C and D. Region A is interpreted as a binary 1 and region D is interpreted as a binary 0. Each region A, B, C and D corresponds to a reading pattern from the three read operations and therefore each region is differentiable. For example, region A is labelled by '111', region B is labelled by '011', region C is labelled by '001' and region D is labelled by '000'.

Bits falling in each region are usually mapped to an LLR value using a predetermined lookup table. FIG. 5 illustrates an example of an LLR lookup table (LUT) 500, according to an embodiment of the disclosure. The assigned LLR values in FIG. 5 are then sent to a decoder for soft decoding. If the decoding still fails, other error recovery steps/plans are executed. The information derived from multiple read operations results in labelling each region using FIG. 4, guides the subsequent LLR mapping.

According to one or more embodiments of the present disclosure, additional information is obtained from the existing multiple read operations, to customize one or more read parameters for data recovery, as discussed hereinafter. In some embodiments, exemplary error recovery techniques are provided that process three or more read values of a given codeword or page to determine read parameters comprising (i) LLRs, and/or (ii) center $V_{ref}$ as discussed further below.

Available Data Statistics

A signal count of a specified region is defined as the number of bits falling in that region. In the example of FIG. 4, the signal count, S, of each region (A, B, C and D) can be represented by $S_A$, $S_B$, $S_C$ and $S_D$, respectively. If reference data is available, the signal counts of the four regions are also available for the given read operations. The values of signal counts provide insights on the center $V_{ref}$ location with respect to a substantially optimum value, as well as the reliability of the bits falling in those regions. For example, if $S_B \approx S_C$, the center $V_{ref}$ $T_C$ is likely to be close to a substantially optimum value, and the bits falling in regions B and C have a similar reliability level; if $S_B \ll S_C$, the center $V_{ref}$ $T_C$ is likely to locate to the right of the substantially optimum value and the bits falling in region C might have a higher reliability level than those bits falling in region B. The following sections explain how LLR values and center $V_{ref}$ are estimated using these bin counts, in some embodiments of the disclosure.

LLR Estimation

In a flash memory, neighboring bits are mapped to the same LLR value. For example, the LLR of region A is mathematically defined in equation (1), $$LLR(A) = \log \frac{\text{number of bits read in } A \text{ that were programmed as "0"}}{\text{number of bits read in } A \text{ that were programmed as "1"}} \quad (1)$$

Likewise, LLR(B), LLR(C) and LLR(D) can be defined in a same manner.

Conventionally, one or more predetermined LLR-LUTs are used for LLR mapping. FIG. 6 illustrates an example of a multiple LLR LUT 600, according to one embodiment of the disclosure. Once three read operations are issued, the decoder tries to decode the data with LLR LUT, 2, . . . , N of FIG. 6, e.g., sequentially, until one of the LUTs successfully recovers the data.

Usually region A and D in FIG. 4 are regarded as high reliable regions, where bits are considered to be 0 and 1, respectively, with a high probability. Therefore, regions A and D are usually assigned LLR values with large absolute values (for example, −7 and 7 as shown in FIG. 6). The sensitive regions are B and C, where errors typically occur. The values of LLR(B) and LLR(C) in FIG. 6 are therefore important for error correction decoder. A predetermined LUT, such as the LUT of FIG. 6, lacks the flexibility to accommodate various noise patterns in the data. The following discussion shows how to estimate LLR(B) and LLR(C) dynamically using signal counts of different regions. LLR(A) and LLR(D) can be estimated in a similar manner, as would be apparent to a person of ordinary skill in the art, based on the discussion herein.

The correlation between LLR values and signal counts metric is first derived. For each codeword, the values of LLR(B) and LLR(C) can be calculated using equation (1), given the availability of genie data. With 3 read operations, the signal counts $S_B$ and $S_C$ are also available. It can be shown that both LLR(B) and LLR(C) have a positive correlation with the signal counts metric ($S_B$−$S_C$).

Figure 7:
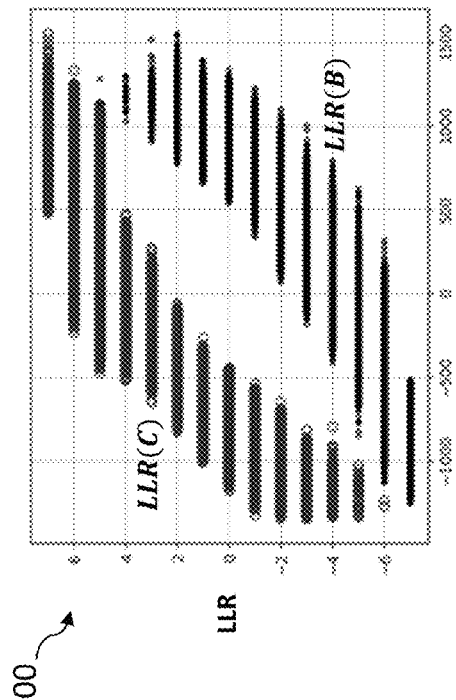
FIG. 7 illustrates LLR Values as a function of a Signal Counts Metric, for an exemplary flash memory device.

FIG. 7 illustrates LLR Values as a function of the Signal Counts Metric ($S_B$−$S_C$) 700, for an exemplary Toshiba BiCS3 NAND flash memory device. In FIG. 7, each point represents either a pair of either (LLR(B), $S_B$−$S_C$) (lower right portion of plot) or (LLR(C), $S_B$−$S_C$) (upper left portion) derived from a single codeword, using equation (1).

If such information (pairs) from enough codewords are collected, the correlation between LLR values and signal counts metric $S_B$−$S_C$, as shown in FIG. 7, can be represented by a linear fitted curve.

Figure 8:
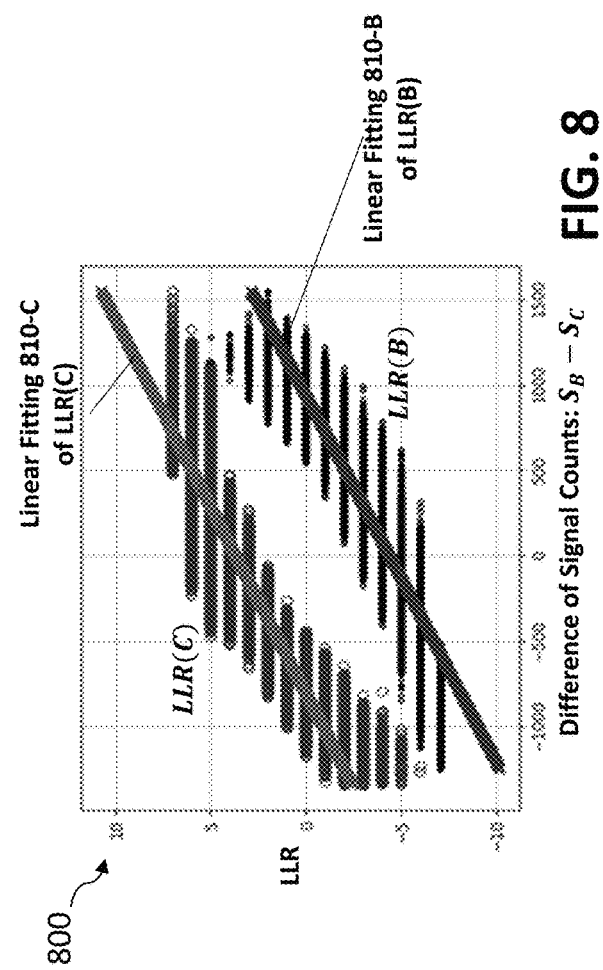
FIG. 8 illustrates a linear fitting to fit the LLR/signal metric pairs of FIG. 7, for the exemplary flash memory device.

FIG. 8 illustrates a linear fitting 800 using linear curves 810-C and 810-B, to fit the (LLR(B), $S_B$−$S_C$) and (LLR(C), $S_B$−$S_C$) pairs of FIG. 7, for the exemplary Toshiba BiCS3 NAND flash memory device.

The linear curves 810-B and 810-C are fitted for LLR(B) and LLR(C), respectively, and can be represented by equation (2) and (3), $$LLR(B, S_B-S_C) = a_B * (S_B-S_C) + b_B, \quad (2)$$

$$LLR(C, S_B-S_C) = a_C * (S_B-S_C) + b_C. \quad (3)$$

The disclosed techniques for representing the correlation between LLR values and signal counts metric using linear curves 810-B and 810-C can be extended to employ non-linear curves as well, as described, for example, in U.S. patent application Ser. No. 16/144,65, filed Sep. 27, 2018, entitled "Page-Level Reference Voltage Parameterization For Solid State Storage Devices," incorporated by reference herein in its entirety.

Figure 9:
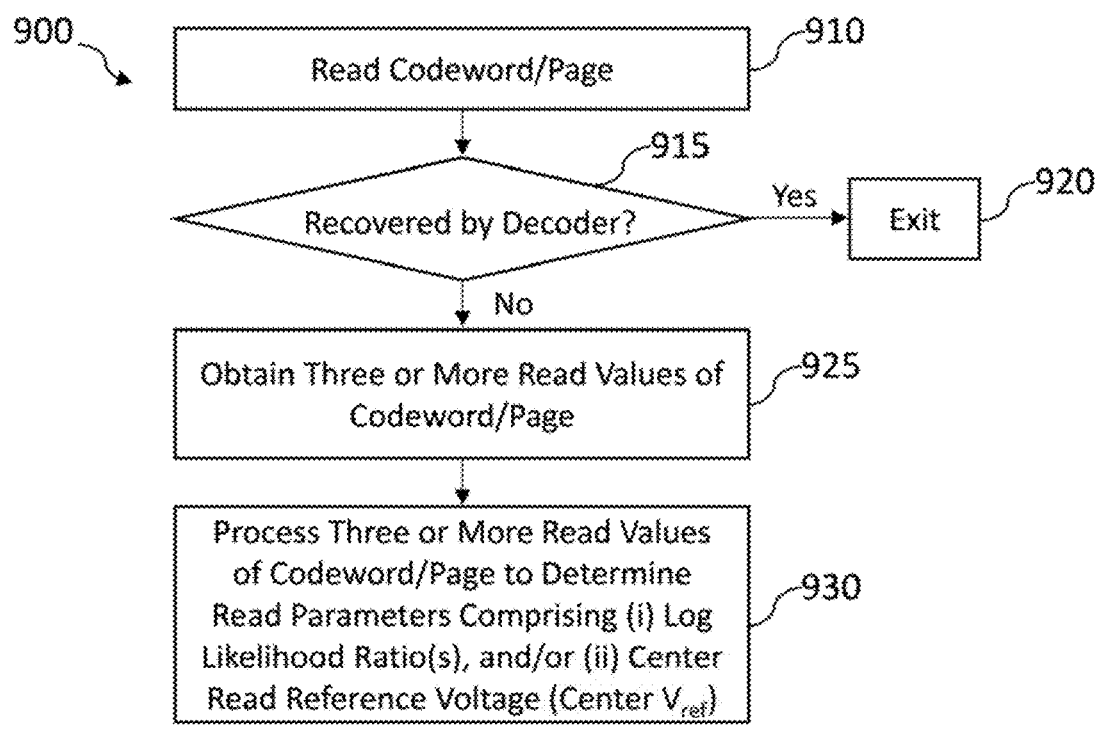
FIG. 9 is a flow chart illustrating an exemplary implementation of an error recovery process for read parameter prediction, according to one embodiment of the disclosure.

FIG. 9 is a flow chart illustrating an exemplary implementation of an error recovery process 900 for read parameter prediction, according to one embodiment of the disclosure. As shown in FIG. 9, the exemplary 900 initially reads a codeword/page during step 910. A test is performed during step 920 to determine if the codeword/page is recovered by the decoder.

If it is determined during step 920 that the codeword/page is recovered by the decoder, then program control exits during step 920. If, however, it is determined during step 920 that the codeword/page is not recovered by the decoder, then three or more read values are obtained of the codeword/page during step 925.

During step 930, the exemplary error recovery process 900 processes the three or more read values of codeword/page to determine read parameters comprising (i) LLRs, and/or (ii) center $V_{ref}$, as discussed further below.

Figure 10:
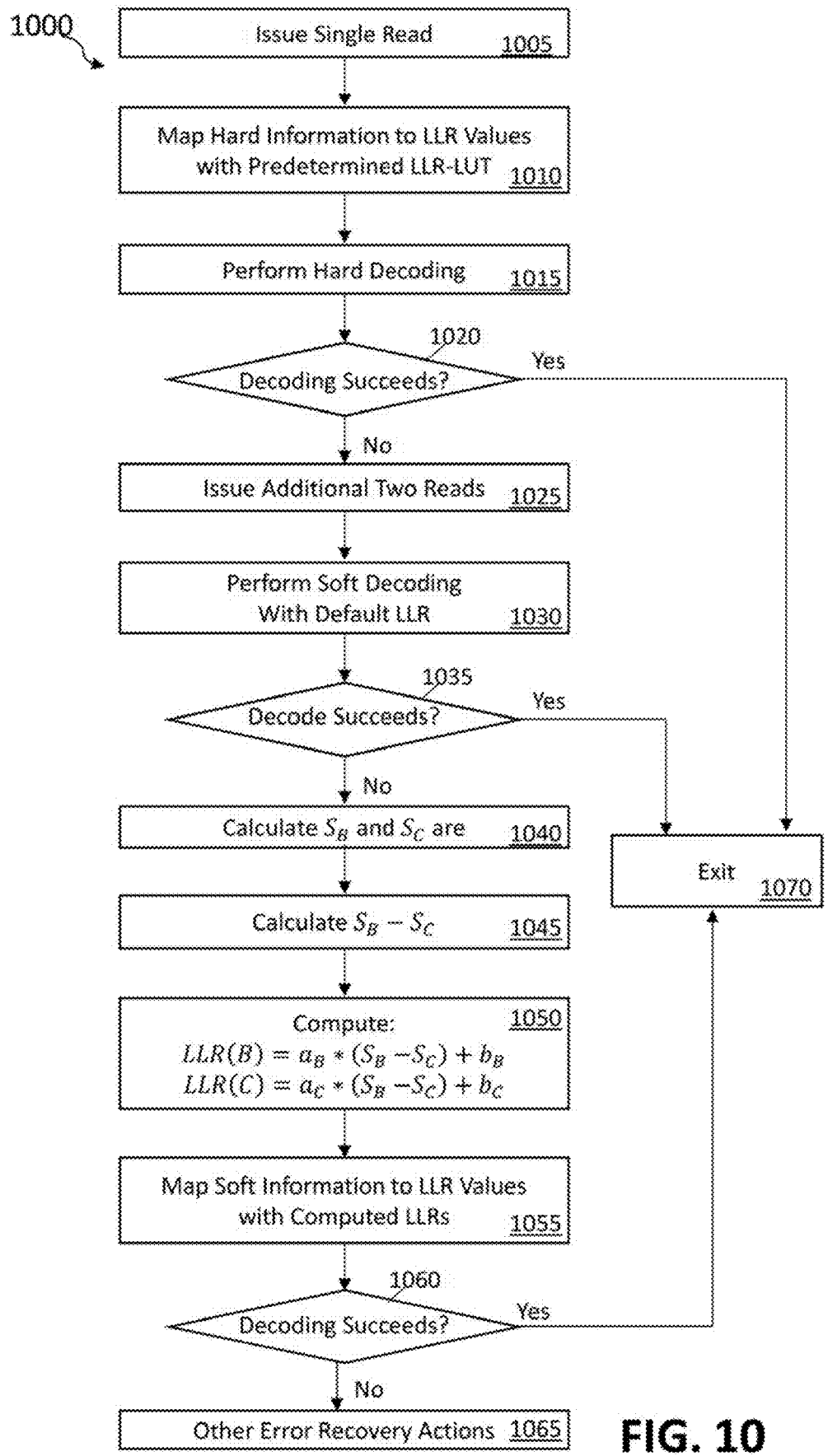
FIG. 10 is a flow chart illustrating an exemplary implementation of an error recovery process using customized LLR values, according to an embodiment.

FIG. 10 is a flow chart illustrating an exemplary implementation of an error recovery process 1000 using customized LLR values, according to one embodiment of the disclosure. Generally, after additional read operations are issued and soft decoding with default (predetermined) LLR LUT fails, the metric $S_B$–$S_C$ is calculated and the customized LLR values are calculated using equations (2) and (3). The newly calculated LLR values are then used to map soft information (instead of using the predetermined LLR-LUTs shown in FIG. 5). Since the metric $S_B$–$S_C$ is dynamically calculated/measured for each codeword (or page) and the LLR values are calculated in this manner as well. It can thus be shown that the exemplary error recovery process 1000 of FIG. 10 will yield a more accurate reliability level for the decoder. Note that, in some embodiments, the LLR estimation is accomplished with the existing multiple read operations without additional read operations.

As shown in FIG. 10, the exemplary error recovery process 1000 initially issues a single read operation during step 1005. The hard information is then mapped to LLR values during step 1010 with a predetermined LLR-LUT for decoding (e.g., that maps bits to two values in some embodiments (e.g., −7 and 7)). Hard decoding is then performed during step 1015.

A test is performed during step 1020 to determine if the decoding succeeds. If it is determined during step 1020 that decoding succeeds, then program control exits during step 1070. If, however, it is determined during step 1020 that decoding does not succeed, then two additional read operations are issued during step 1025. A test is performed during step 1035 to determine if the decoding succeeds. If it is determined during step 1035 that decoding succeeds, then program control exits during step 1070. If, however, it is determined during step 1035 that that decoding does not succeed, then $S_g$ and $S_C$ are calculated during step 1040 using equation (1) and the metric $S_B$–$S_C$ is calculated during step 1045. LLR(B) and LLR(C) values are computed during step 1050 using equations (2) and (3).

Soft Information is mapped to LLR Values with Computed LLRs during step 1055. A test is performed during step 1060 to determine if the decoding succeeds. If it is determined during step 1060 that decoding succeeds, then program control exits during step 1070. If, however, it is determined during step 1060 that decoding does not succeed, then other Error Recovery Actions are optionally performed during step 1065.

One or more aspects of the present disclosure recognize that the parameters $a_B$, $b_B$, $a_C$ and $b_C$ used by step 1050 of the error recovery process 1000 can be calculated using offline data and stored in memory (e.g. a DRAM).

Figure 11:
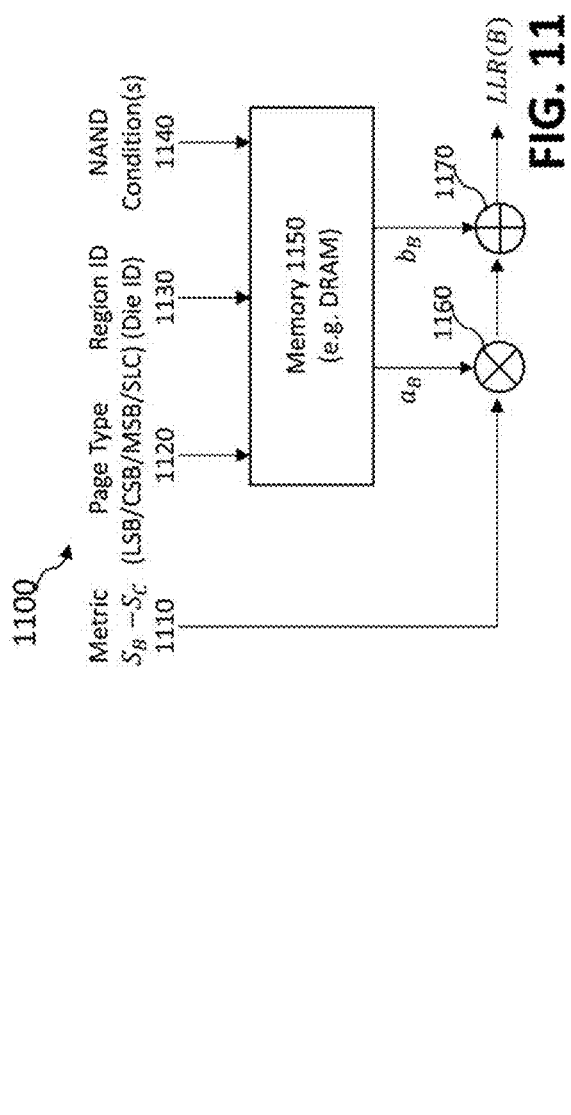
FIG. 11 illustrates an exemplary LLR calculator that uses the disclosed read parameter estimation techniques for a linear model to calculate LLR values, according to at least one embodiment of the disclosure.

FIG. 11 illustrates an exemplary LLR calculator 800 that uses the disclosed read parameter estimation techniques for a linear model to calculate LLR(B), according to at least one embodiment of the disclosure. As shown in FIG. 11, to compute an LLR value for an exemplary page, the exemplary LLR calculator 1100 processes the metric $S_B$–$S_C$ 1110, the page type 1120 (e.g., LSB/CSB/MSB/SLC); a region identifier 1130 (e.g., a die identifier); and/or one or more NAND conditions 840 (e.g., retention, P/E cycle, program/read temperature, etc.), to read the coefficients $a_B$ and $b_B$ from memory 1150 (e.g., a DRAM memory). Representative LLR(B) is computed by the exemplary LLR calculator 800 using equation (2). An implementation for computing LLR (C) would be similar to the implementation for LLR(B), as would be apparent to a person of ordinary skill in the art.

Figure 12:
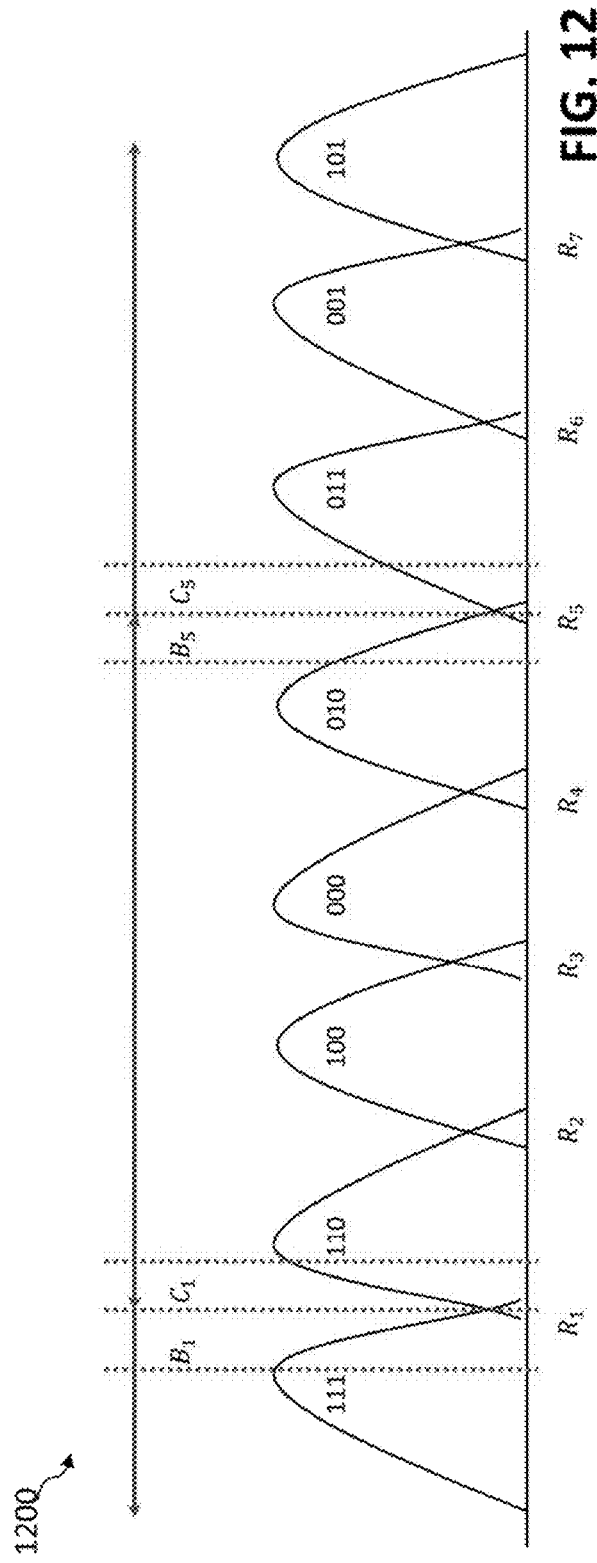
FIG. 12 illustrates various regions for an exemplary LSB page of the exemplary flash memory device.

For a multi-level cell NAND (such as MLC, TLC or QLC), where for some page types multiple reference voltages ($V_{ref}$ values) are involved, the parameters can be tuned for each individual $V_{ref}$. FIG. 12 illustrates various regions for an exemplary LSB page of the exemplary Toshiba BiCS3 NAND flash memory device. For the LSB page of FIG. 12, $R_1$ and $R_5$ are the two relevant $V_{ref}$ values. The regions $B_1$, $C_1$, $B_5$ and $C_5$ are differentiable from the three-read patterns. Therefore, the linear fitting can be conducted independently to derive ($a_{1B}$, $b_{1B}$, $a_{1C}$, $b_{1C}$) for $R_1$ and ($a_{5B}$, $b_{5B}$, $a_{5C}$, $b_{5C}$) for $R_5$ such that, $$LLR(B_i, S_{iB}-S_{iC}) = a_{iB}*(S_{iB}-S_{iC}) + b_{iB}, \quad (4)$$

$$LLR(C_i, S_{iB}-S_{iC}) = a_{iC}*(S_{iB}-S_{iC}) + b_{iC}, \quad (5)$$

where $S_{iB}$ and $S_{iC}$ are the signal counts of region $B_i$ and $C_i$ and $i \in \{1,5\}$.

Figure 13:
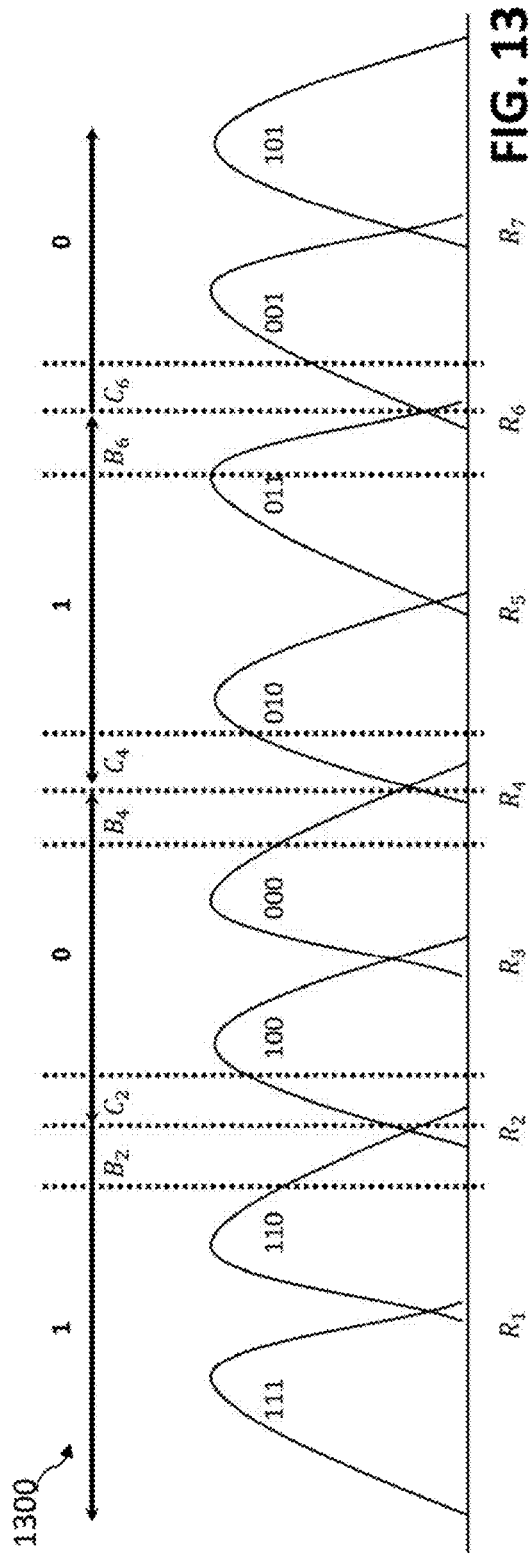
FIG. 13 illustrates various regions for a representative CSB page of the exemplary flash memory device.

In some cases, the regions from different $V_{ref}$ values are not differentiable. FIG. 13 illustrates various regions for a representative CSB page of the exemplary Toshiba BiCS3 NAND flash memory device, where $R_2$, $R_4$ and $R_6$ are the three relevant $V_{ref}$ values. Without reading other pages, the three-read patterns can only measure $B_4$, $C_4$, $B_2+B_6$ and $C_2+C_6$. In other words, the corresponding regions of $R_2$ and $R_6$ are not differentiable.

Figure 14:
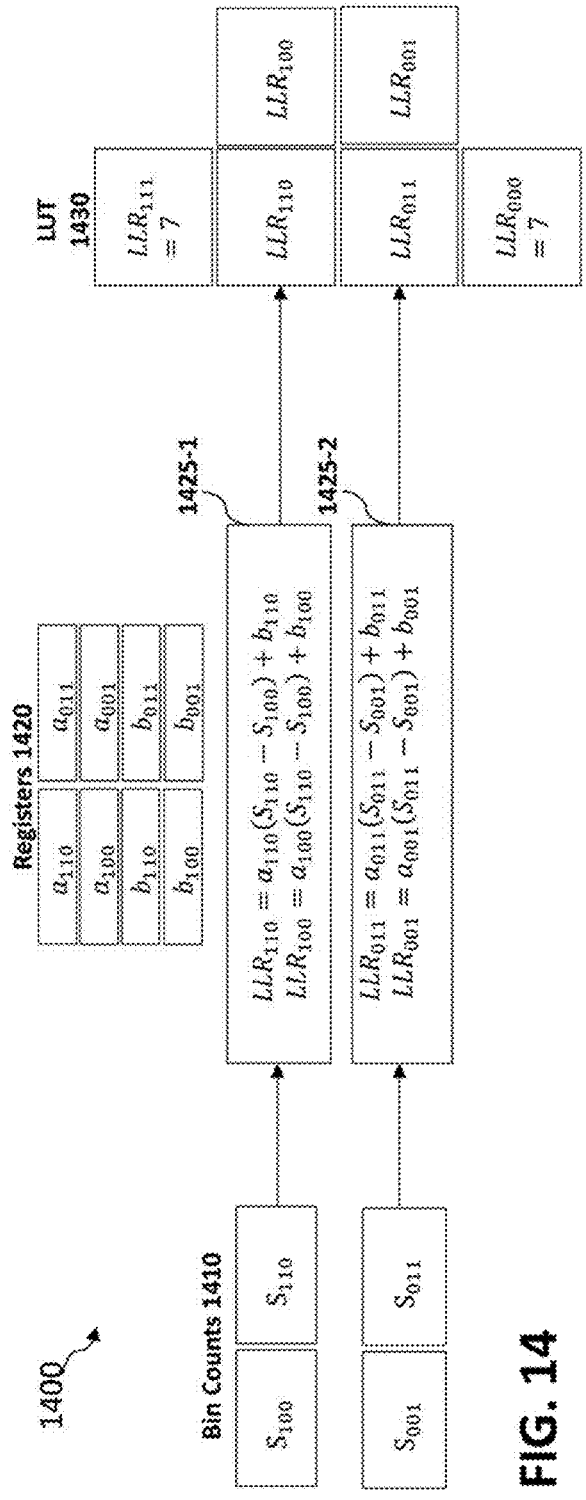
FIGS. 14 and 15 illustrate exemplary implementations for differentiating regions for reference voltages $R_2$ and $R_6$ for the representative CSB page of FIG. 13, according to various embodiments.

In some embodiments, two methods can be applied when the corresponding regions for reference voltages $R_2$ and $R_6$ are not differentiable:

1) Apply a linear fitting for reference voltages $R_2$ and $R_6$ by using the same metric $(S_{2B}+S_{6B})-(S_{2C}+S_{6C})$. FIG. 14 illustrates an exemplary implementation 1400 for differentiating regions for reference voltages $R_2$ and $R_6$ for the representative CSB page of FIG. 13 without supporting pages (e.g., with the existing three read operations) by using the same LLR label for both regions of reference voltages $R_2$ and $R_6$ of FIG. 13, according to an embodiment. Note that the regions $B_j$ and $C_j$ can be labelled by a three-read pattern. For example, with the convention of reading pattern $[T_l T_C T_r]$, $B_2$ and $B_6$ share the same label of '011'; $C_2$ and $C_6$ share the same label of '001'; $B_4$ is labelled as '100' and $C_4$ as '110'. Without supporting pages, the bin counts 1410 in these non-differentiable regions are established as follows: $S_{011}=S_{2B}+S_{6B}$ and $S_{001}=S_{2C}+S_{6C}$. Then, for reference voltages $R_2$ and $R_6$, the fitting becomes, at stages 1425-1 and 1425-2, $$LLR(B_j, S_{011}-S_{001}) = a_{011}*(S_{001}-S_{001}) + b_{011}, \quad (4)$$

$$LLR(C_j, S_{011}-S_{001}) = a_{011}*(S_{001}-S_{001}) + b_{011}, \quad (5)$$

where $j \in \{2,6\}$. Note that the same LLR values are applied to the ambiguous regions, e.g., $LLR(B_2, S_{011}-S_{001})=LLR(B_6, S_{001}-S_{001})=LLR_{011}$ and $LLR(C_2, S_{011}-S_{001})=LLR(C_6, S_{011}-S_{001})=LLR_{001}$. The coefficients as and bs are stored in registers 1420. The resulting LLR values are stored in an LUT 1430.

Figure 15:
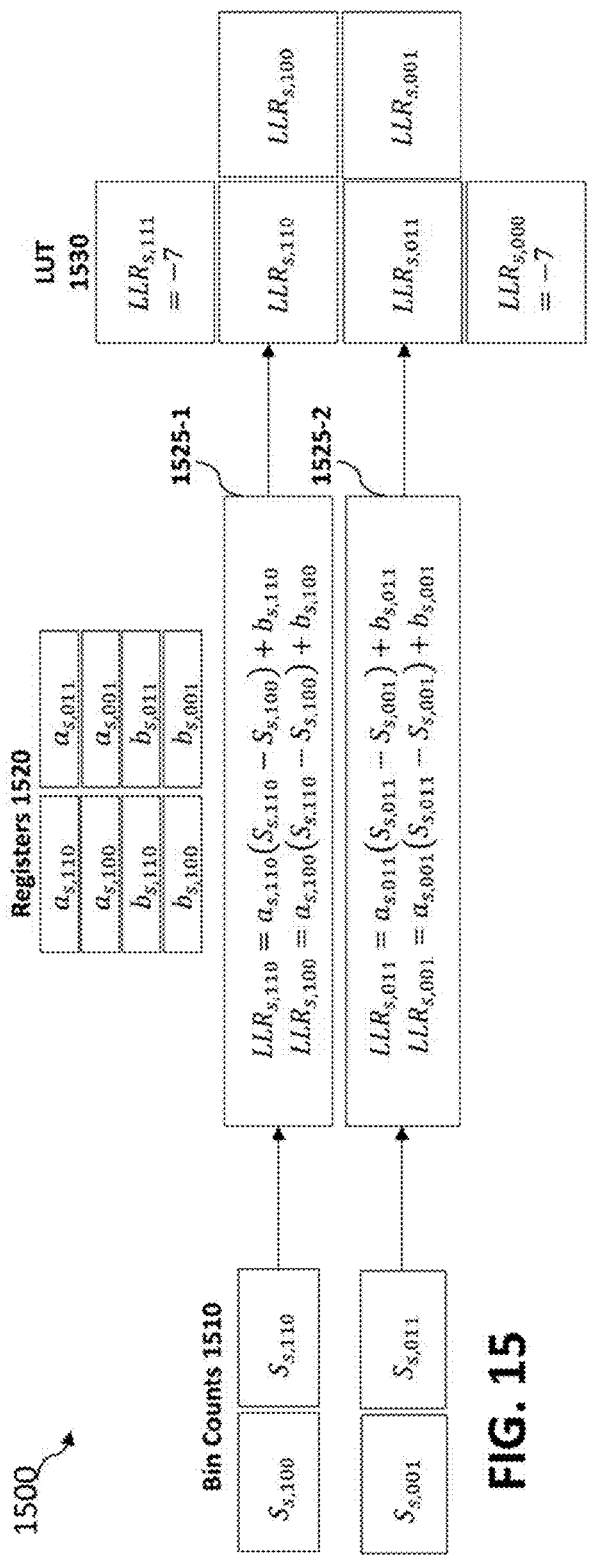

2) Read support pages to differentiate regions of $R_2$ and $R_6$. However, this method requires additional read operations. FIG. 15 illustrates an exemplary implementation 1500 for differentiating regions of reference voltages $R_2$ and $R_6$ for the representative CSB page of FIG. 13 with supporting pages (e.g., with additional read operations), according to some embodiments. In FIG. 15, additional support pages are used help to differentiate regions coming from different thresholds. For example, $S_{2,011}$ denotes the signal count 1510 of region $B_2$, while $S_{6,011}$ denotes the signal count 1510 of region $B_6$. The corresponding LLR values (computed at stages 1525-1 and 1525-12 and are stored in the LUT 1530), such as $LLR_{2,011}$ and $LLR_{6,011}$, are also differentiable. In FIG. 15, s represents different thresholds. With the supporting information, each threshold can calculate its LLR values individually. The coefficients as and bs are stored in registers 1520.

Note that, other type of fittings (e.g., a non-linear fitting) can also be applied for LLR estimation, in the manner described above. The metric is also not necessarily constrained to the difference of the signal counts between two regions specified above. Depending on the NAND characteristics, various fitting methods with various metrics can be applied.

The fitting parameters are calculated offline, but can also be updated on-the-fly whenever new samples are available, as would be apparent to a person of ordinary skill in the art.

Center $V_{ref}$ Estimation

As noted above, the disclosed error recovery techniques can also process the three or more read values of a given codeword or page to determine a center $V_{ref}$ read parameter, as discussed hereinafter. The signal counts of different regions provide insights into the relative location of the current center $V_{ref}$ with respect to a substantially optimum value. Therefore, the signal count metric can also be used to estimate a more effective center $V_{ref}$ read parameter, which is expected to reduce the errors in the raw data.

Figure 16:
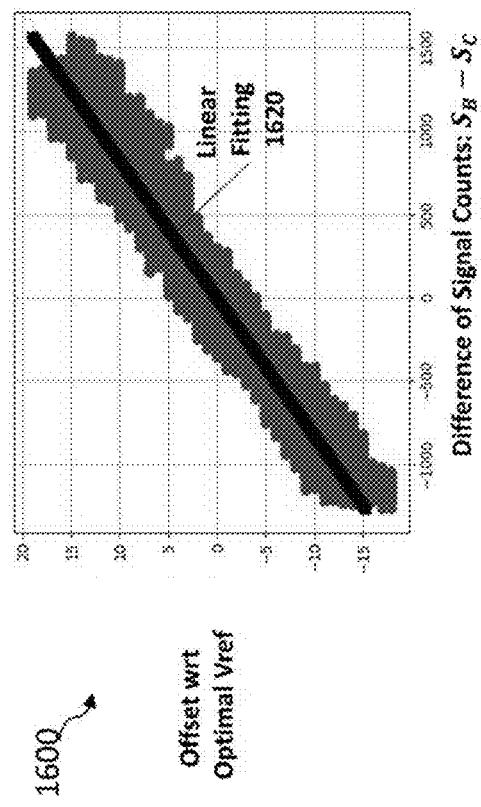
FIG. 16 illustrates the center voltage reference ($V_{ref}$) read parameter as a function of the Signal Counts Metric, for the exemplary flash memory device.

FIG. 16 illustrates the center $V_{ref}$ read parameter as a function of the Signal Counts Metric ($S_B$–$S_C$) 1600, for the exemplary Toshiba BiCS3 NAND flash memory device. In FIG. 16, each point represents a pair of ($V_{ref}$, $S_B$–$S_C$) values. If such information (pairs) from enough codewords are collected, for example, the correlation between center $V_{ref}$ values (with respect to a substantially optimal $V_{ref}$) and the signal counts metric $S_B$–$S_C$, as shown in FIG. 16, can be represented by a linear fitted curve 1620, which can be expressed by equation (6), as follows:

$$V = \alpha*(S_B-S_C) + \beta. \quad (6)$$

Figure 17:
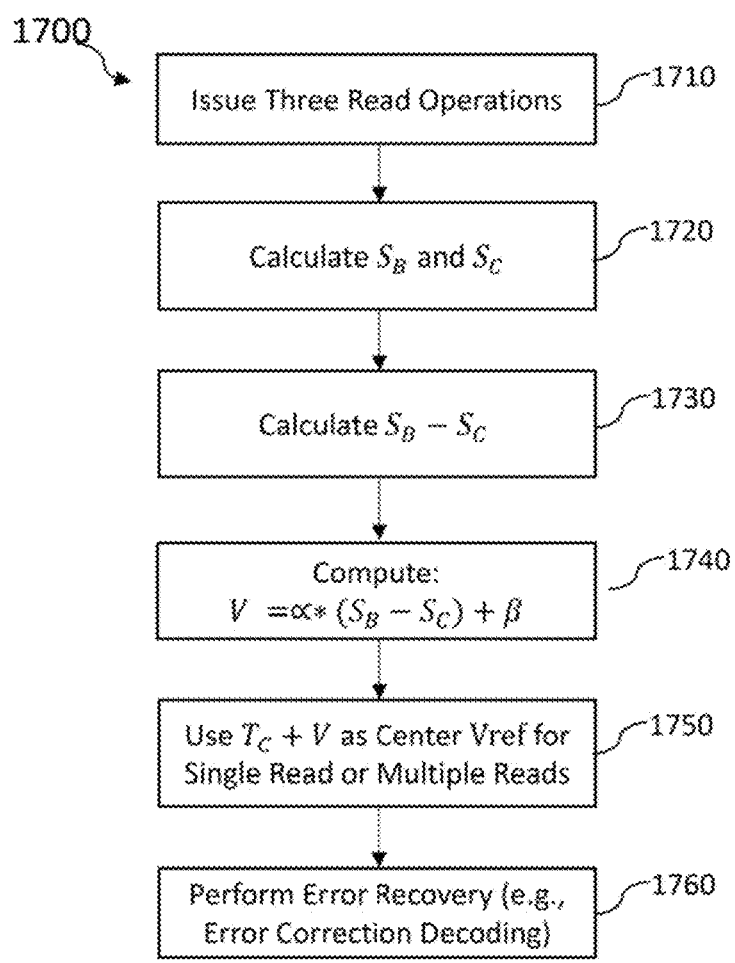
FIG. 17 is a flow chart illustrating an exemplary implementation of an error recovery process using customized center $V_{ref}$ values, according to one embodiment of the disclosure.

FIG. 17 is a flow chart illustrating an exemplary implementation of an error recovery process 1700 using customized center $V_{ref}$ values, according to one embodiment of the disclosure.

As shown in FIG. 17, the exemplary error recovery process 1700 initially issues three read operations during step 1710. Thereafter, the signal counts, $S_B$ and $S_C$, are calculated during step 1720, and the signal counts metric, $S_B$–$S_C$, is calculated during step 1730.

Equation (6) is employed during step 1740 to compute the center $V_{ref}$ value, by obtaining the corresponding parameters $\propto$ and $\beta$ from memory for the center $V_{ref}$ calculation. During step 1750, $T_C$ (current center $V_{ref}$; see, e.g., FIG. 4) and V are used as the new center $V_{ref}$ value for a single read operation or multiple read operations. Finally, additional error recovery (e.g., error correction decoding) is performed during step 1760.

It is noted that the linear fitting parameters can be tuned for each individual $V_{ref}$, and various NAND conditions, as would be apparent to a person of ordinary skill in the art, in a manner Similar to the LLR estimation techniques described above.

Combination of LLR Estimation and Center $V_{ref}$ Estimation

Figure 18A:
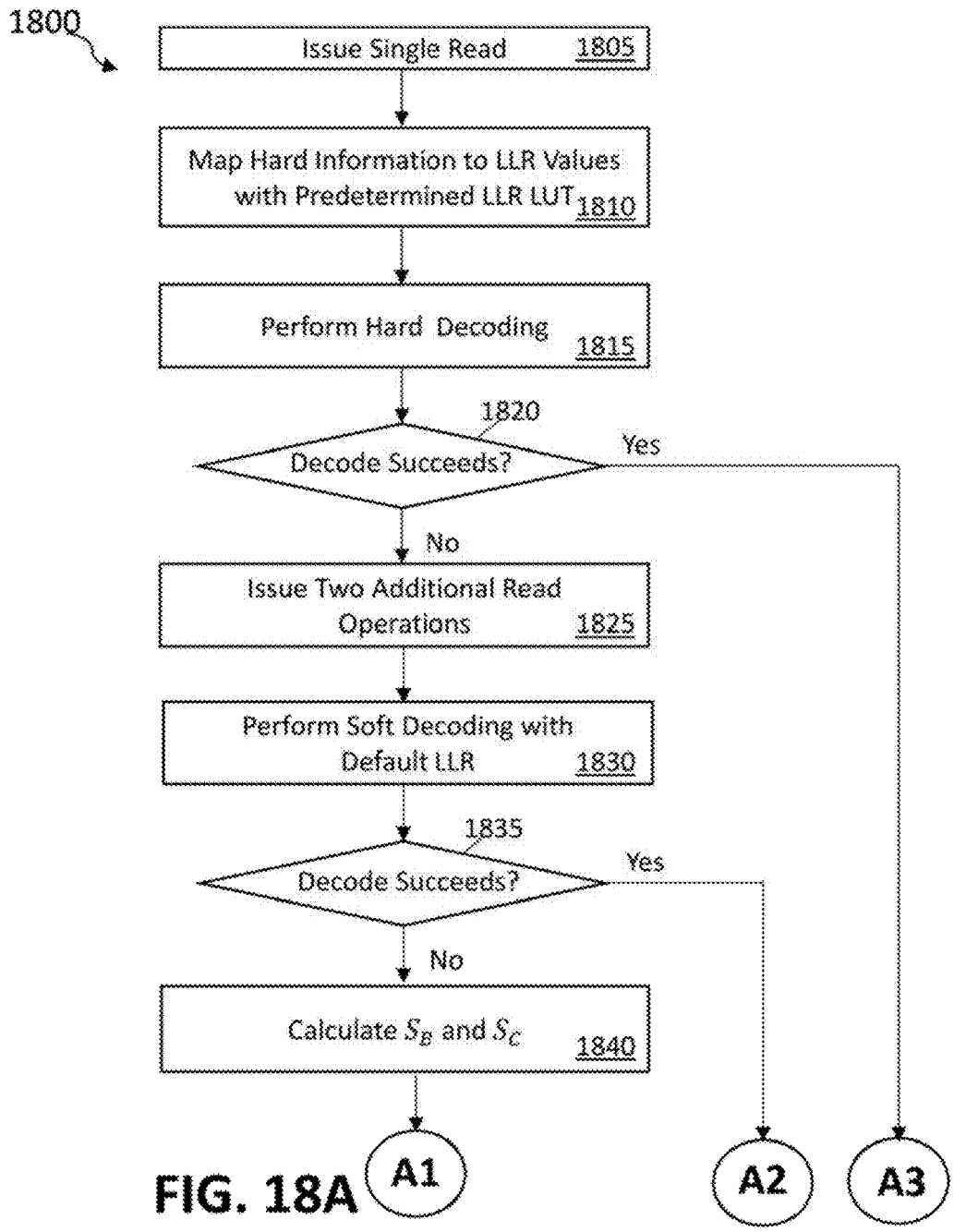
FIGS. 18A and 18B, collectively, comprise a flow chart illustrating an exemplary implementation of an error recovery process using customized LLR values and center $V_{ref}$ values, according to an embodiment.
Figure 18B:
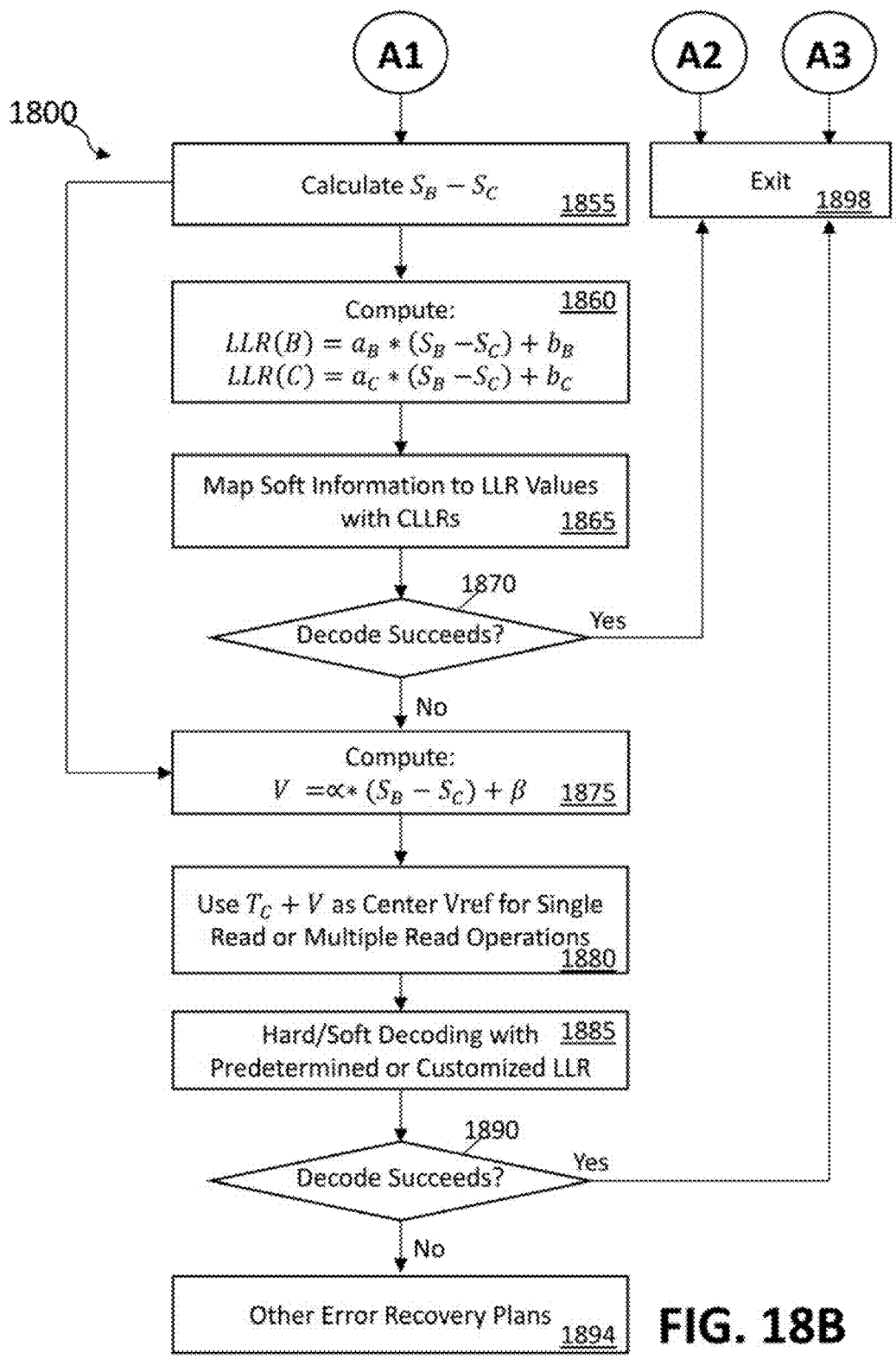

FIGS. 18A and 18B, collectively, are a flow chart illustrating an exemplary implementation of an error recovery process 1800 using customized LLR values and center $V_{ref}$ values, according to one embodiment of the disclosure. As noted above, with three existing read operations, LLR values and center $V_{ref}$ offset values can be calculated independently. The disclosed error recovery techniques can incorporate one or both of the customized LLR values and center $V_{ref}$ values. When both values and center $V_{ref}$ offset values are included, the execution order can be performed in either manner. In the exemplary embodiment of FIG. 18, decoding is performed first using customized LLR values, followed by the new center $V_{ref}$ offset values.

As shown in FIG. 18A, the exemplary error recovery process 1800 initially issues a single read operation during step 1805. The hard information is then mapped to LLR values during step 1810 (e.g., with a predetermined LLR-LUT (e.g., of FIG. 5 or FIG. 6)). Hard decoding is then performed during step 1815.

A test is performed during step 1820 to determine if the decoding succeeds. If it is determined during step 1820 that decoding succeeds, then program control proceeds to FIG. 18B and exits during step 1898. If, however, it is determined during step 1820 that decoding does not succeed, then two additional read operations are issued during step 1825. A test is performed during step 1835 to determine if the decoding succeeds. If it is determined during step 1835 that decoding succeeds, then program control proceeds to FIG. 18B and exits during step 1898. If, however, it is determined during step 1835 that that decoding does not succeed, then $S_B$ and $S_C$ are calculated during step 1840 (e.g., using equation (1)). Program control then proceeds to FIG. 18B.

As shown in FIG. 18B, the exemplary error recovery process 1800 then calculates the metric $S_B$–$S_C$ during step 1855. LLR(B) and LLR(C) values are computed during step 1860 (e.g., using equations (2) and (3)).

Soft Information is mapped to LLR Values with Computed LLRs during step 1865. A test is performed during step 1870 to determine if the decoding succeeds. If it is determined during step 1870 that decoding succeeds, then program control exits during step 1898. If, however, it is determined during step 1870 that decoding does not succeed, then Equation (6) is employed during step 1875 to compute the new center $V_{ref}$ value (e.g., by obtaining the corresponding parameters $\propto$ and $\beta$ from memory for the center $V_{ref}$ calculation). During step 1880, $T_C$ (current center $V_{ref}$; see, e.g., FIG. 4) and V are used as the new center $V_{ref}$ value for a single read operation or for multiple read operations.

During step 1885, hard and/or soft decoding is performed with predetermined or customized LLR values. A test is performed during step 1890 to determine if the decoding succeeds. If it is determined during step 1890 that decoding succeeds, then program control exits during step 1898. If, however, it is determined during step 1890 that decoding does not succeed, then additional error recovery (e.g., error correction decoding) is performed during step 1894.

Figure 19:
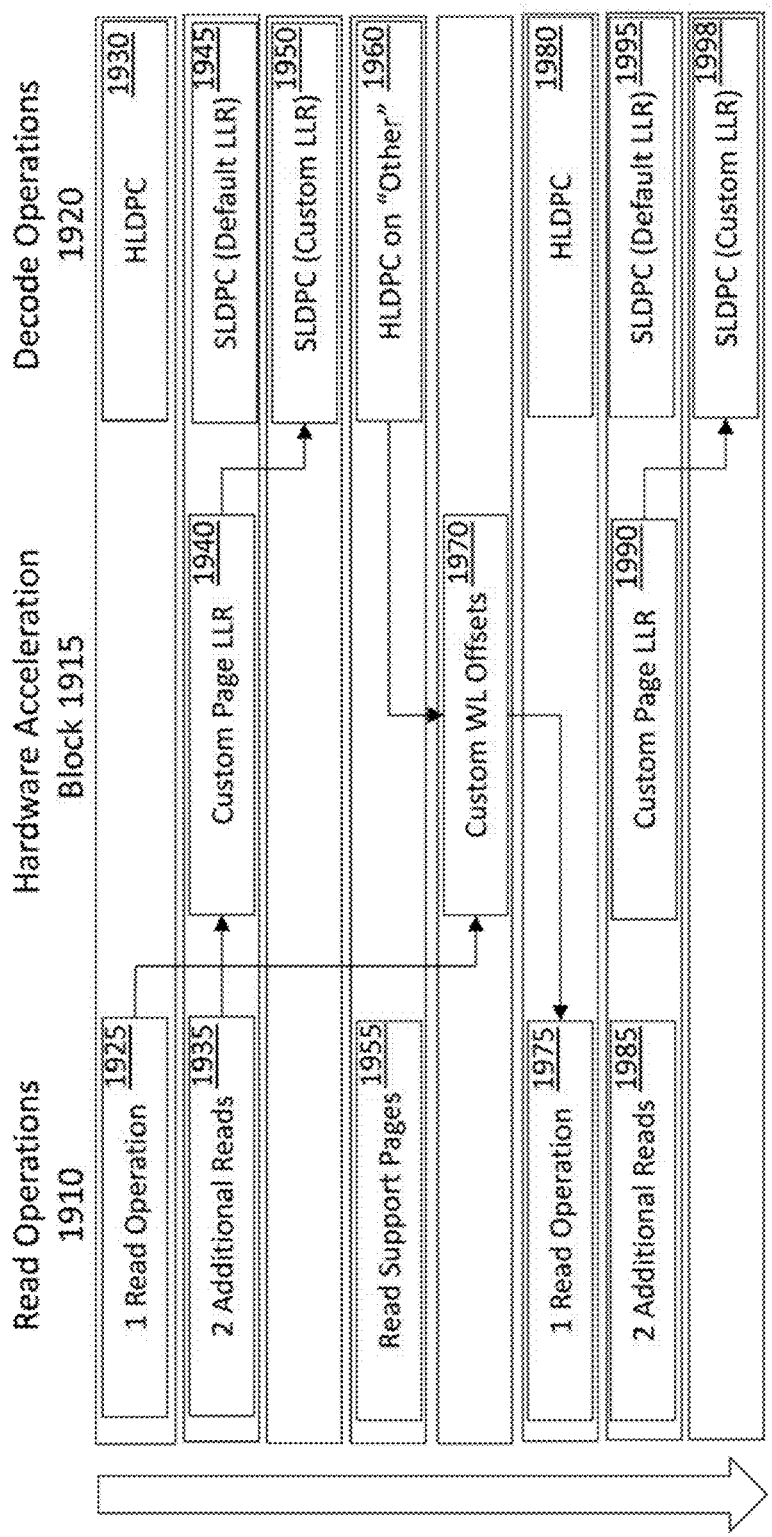
FIG. 19 illustrates an exemplary parallel implementation of an error recovery process using customized LLR values and center $V_{ref}$ values, according to one embodiment of the disclosure.

FIG. 19 illustrates an exemplary parallel implementation of an error recovery process 1900 using customized LLR values and center $V_{ref}$ values, according to an embodiment. Generally, the processing timeline for FIG. 19 proceeds from left to right, and downward. The exemplary error recovery process 1900 comprises a set of read operations 1910, a hardware acceleration block 1915 and a set of decode operations 1920. Thus, in the exemplary embodiment of FIG. 19, the parallelism is achieved by using a dedicated hardware block 1915 to perform parameter estimation.

As shown in FIG. 19, the exemplary parallel error recovery process 1900 initially performs a single read operation during step 1925 and then applies hard decoding during step 1930. Two additional read operations are performed during step 1935 and then a customized page LLR is computed by hardware acceleration block 1940, in accordance with the disclosed techniques. Conventional soft decoding is applied during step 1945 using default LLRs, while soft decoding is also applied in parallel during step 1950 using the customized LLRs computed by hardware acceleration block 1940, in accordance with the disclosed techniques.

As shown in FIG. 19, additional support pages are read during step 1955 and hard decoding is applied during step 1960, using the techniques discussed above in conjunction with FIGS. 12 and 13. Customized wordline offsets are computed during step 1970 to compute the new center $V_{ref}$ value.

The new center $V_{ref}$ value is used for a single read operation during step 1975 and then hard decoding is applied during step 1980. Two additional read operations are performed during step 1985 and then a customized page LLR is computed by hardware acceleration block 1990, in accordance with the disclosed techniques. Conventional soft decoding is applied during step 1995 using default LLRs, while soft decoding is also applied in parallel during step 1998 using the customized LLRs computed by hardware acceleration block 1990, in accordance with the disclosed techniques.

Implementation Options

Figure 20:
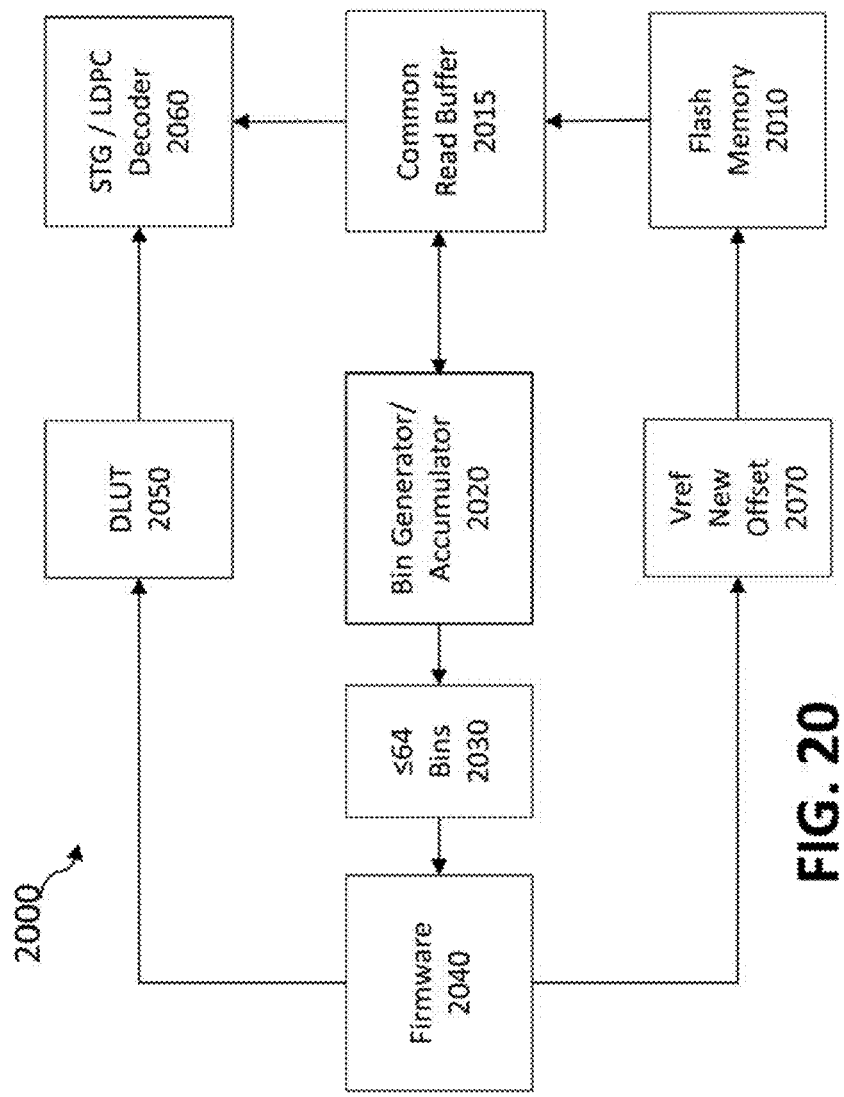
FIG. 20 illustrates an exemplary firmware implementation of an error recovery system using customized LLR values and center $V_{ref}$ values, according to some embodiments.

FIG. 20 illustrates an exemplary firmware implementation of an error recovery system 2000 using customized LLR values and center $V_{ref}$ values, according to some embodiments. As shown in FIG. 20, data is read from a flash memory 2010 and stored in a common read buffer 2015. A dedicated bin generation/accumulation block 2020 then measures the statistics for each bin (e.g., $S_B$ and $S_C$, for example). To accommodate a QLC format, for example, there are up to 64 bins 2030. In the embodiment of FIG. 20 with firmware intervention, the prediction of LLR LUTs and the new center $V_{ref}$ offset are performed by firmware 2040.

The customized LLR values are stored in a digital LUT (DLUT) 2050 and used for LDPC decoding 2060 of the read values from buffer 2010. The new center $V_{ref}$ offset 2070 is used for a new read operation applied to the flash memory 2010.

Figure 21:
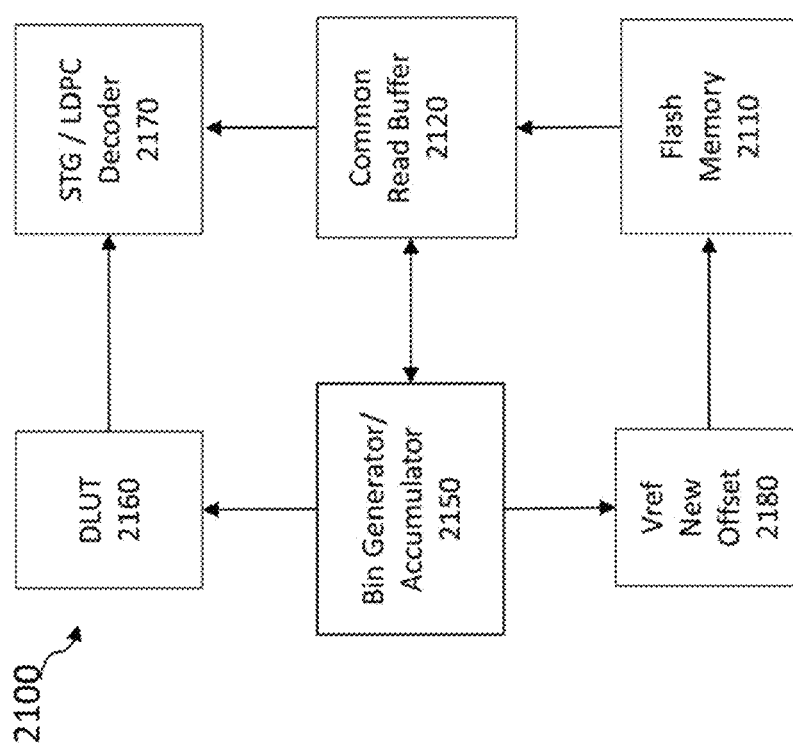
FIG. 21 illustrates an exemplary hardware implementation of an error recovery system using customized LLR values and center $V_{ref}$ values, according to one or more embodiments.

FIG. 21 illustrates an exemplary hardware implementation of an error recovery system 2100 using customized LLR values and center $V_{ref}$ values, according to one or more embodiments. As shown in FIG. 21, data is read from a flash memory 2110 and stored in a common read buffer 2120. A dedicated bin generation/accumulation block 2150 then measures the statistics for each bin (e.g., $S_B$ and $S_C$, for example). In the embodiment of FIG. 21 with a hardware implementation, the customized LLR values are stored in a DLUT 2160 and used for LDPC decoding 2170 of the read values from buffer 2120. The new center $V_{ref}$ offset 2180 is used for a new read operation applied to the flash memory 2110.

In some embodiments, an important aspect of a hardware implementation is the generality and flexibility, as mapping between pages and symbols varies between flash vendors and flash generations. The disclosed architecture in FIG. 21 uses programmable tables to retain sufficient flexibility.

Assume that the hardware contains a mechanism to bin the result of three read operations with different threshold voltages. The binary values are then concatenated into three-bit words resulting in eight different values (0-7 decimal) which are used as address into bins. The bins are incremented every time a particular value is obtained resulting in a histogram of the different symbols. If supporting information is available, then separate groups of eight bins correspond to each combination of the supporting information.

Once sufficient statistics have been accumulated, the LLR values (and threshold voltage offsets) can be calculated by a state machine that relies on several tables loaded by firmware.

Figure 22:
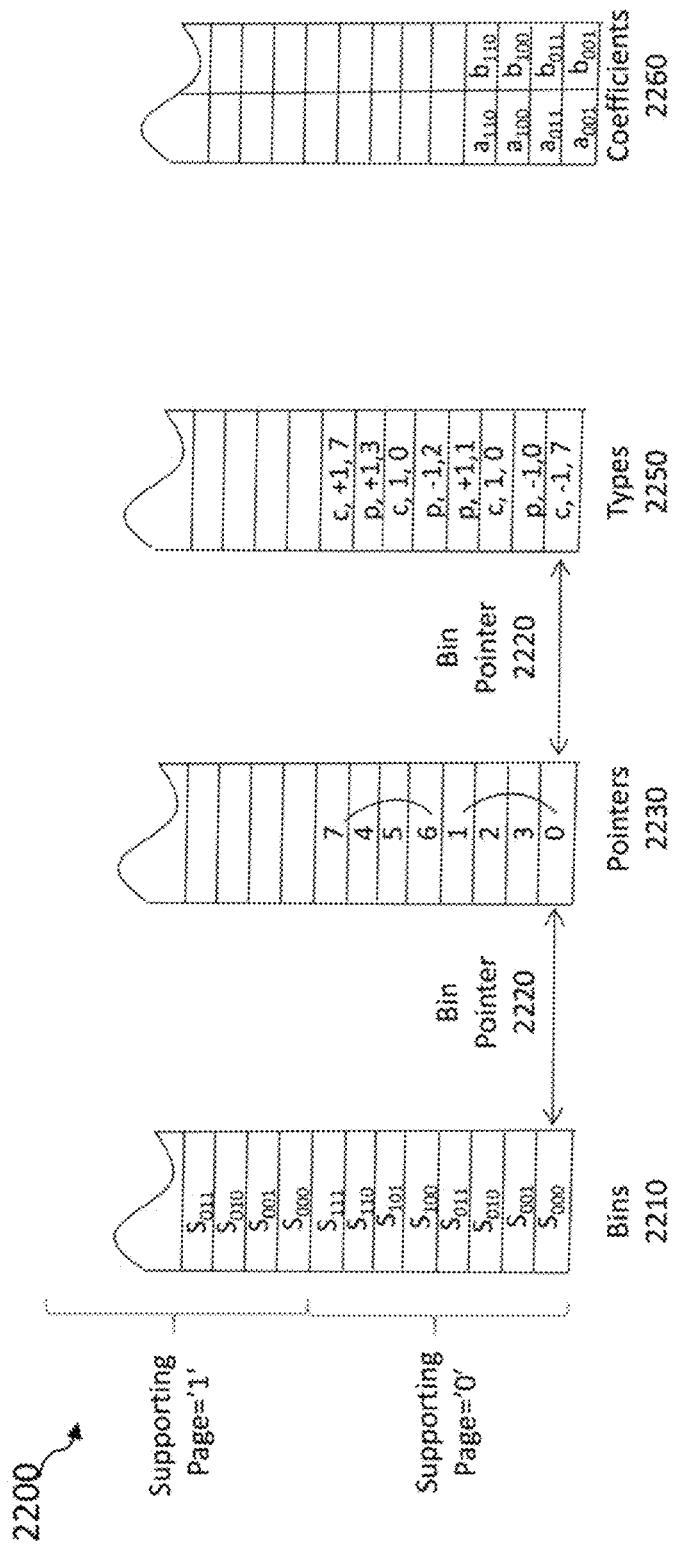
FIG. 22 illustrates exemplary hardware tables for supporting LLR calculations, according to an embodiment of the disclosure.

FIG. 22 illustrates exemplary hardware tables 2200 for supporting LLR calculations, according to one embodiment of the disclosure. As shown in FIG. 22, the exemplary hardware tables 2200 comprise bins 2210, a first bin pointer 2220, pointers 2230, a second bin pointer 2240, types 2250 and coefficients 2260.

The exemplary hardware tables 2200 provide an implementation of the calculation discussed above in conjunction with FIG. 15. Thus, the exemplary hardware tables 2200 differentiate regions of reference voltages $R_2$ and $R_6$ for the representative CSB page of FIG. 13 with supporting pages '1' and '0' (e.g., with additional read operations of pages '1' and '0'). Bins 2210 correspond to the bin counts 1510, and the coefficients 2260 correspond to the registers 1520.

Generally, the bins table 2210, pointers table 2230 and types table 2250 are all addressed using the same bin pointer 2220. The pointers table 2230 is used to implement linked lists that enable sums and/or differences of arbitrary bin values. The types table 2250 allows the state machine to generate both constant LLR values (such as +/−7 for high confidence regions) and computed LLR values for the remaining regions. If the types table 2250 contains a constant field, then the entries are 'c', sign and magnitude of the constant. The pointer field 2230 contains a 'p', a sign bit indicating whether the accumulated bin value should be added or subtracted and a coefficient pointer (cp) providing an address for the coefficients table 2260.

For example, the $LLR_{110}$ value shown in FIG. 15 can be calculated by the following steps. Assume that the bin pointer 2220 has reached address 6. The type is then 'p' with a sign of +1, so a variable is initialized to $+S_{110}$. The bin pointer 2220 is then replaced with the value of the pointer table 2230 at address 6, which is 4. The type entry from table 2250 at address 4 is again 'p' with a sign of −1. The variable is then updated to $+S_{110}-S_{100}$. The bin pointer 2220 is again replaced by the value at address 4, which is 6. Since this is the original value, the process terminates with a calculation of the LLR value using the last entry of the types table 2250 at address 6 as a coefficient pointer to the coefficient table 2260. At address 6, this pointer is 3 which then enables the state machine to calculate the $LLR_{110}$ value as $a_{110}*(+S_{110}-S_{100})+b_{110}$.

Figure 23:
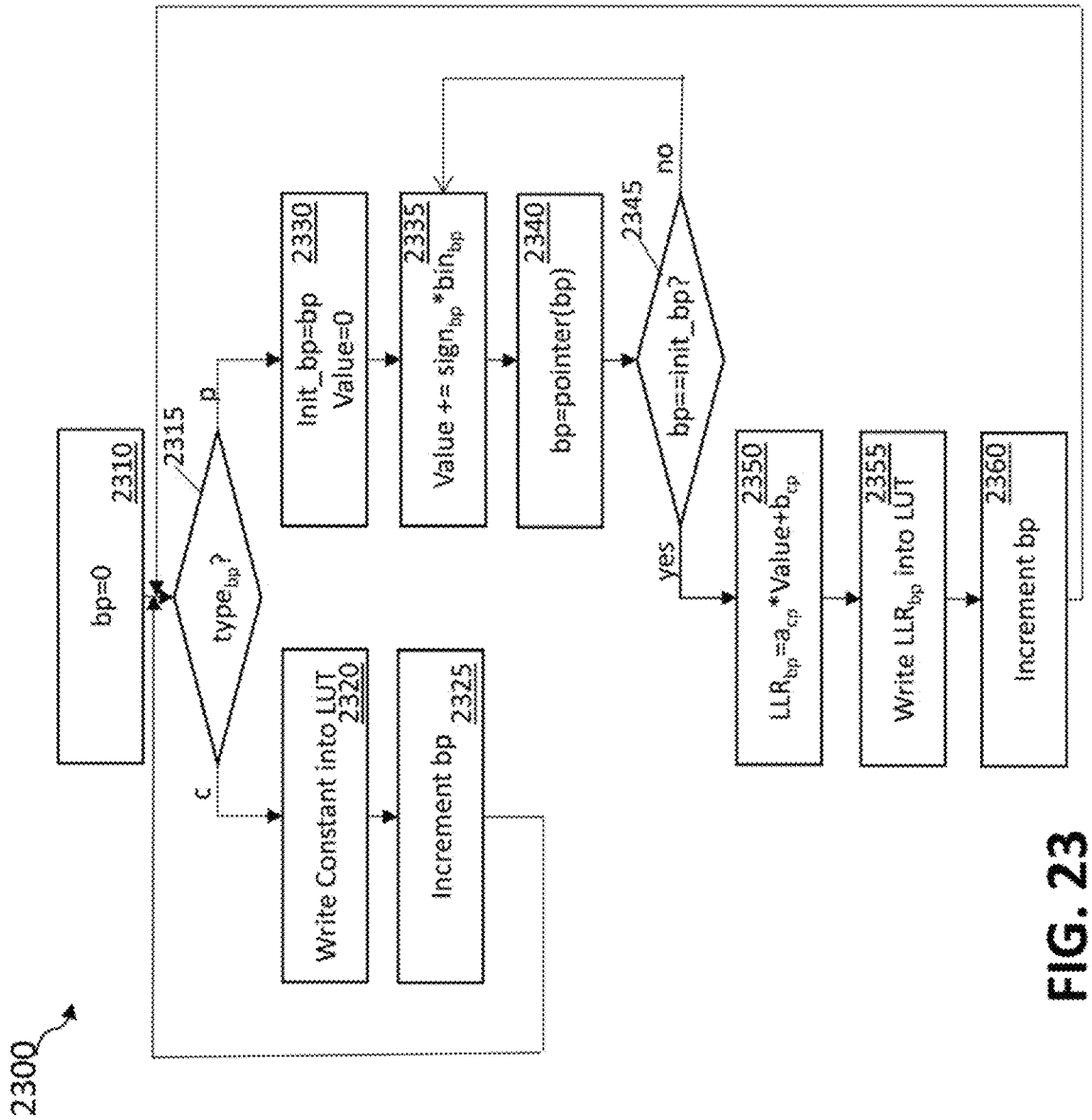
FIG. 23 is a flow chart illustrating an exemplary implementation of a state machine discussed in conjunction with FIG. 22, according to one or more embodiments of the disclosure.

FIG. 23 is a flow chart illustrating an exemplary implementation of the state machine discussed in conjunction with FIG. 22, according to one or more embodiments of the disclosure. As shown in FIG. 23, the bin pointer (bp) 2220 is initialized to zero during step 2310. A test is performed during step 2315 to determine if the entry in the types table 2250 pointed to by the bin pointer 2220 is of type c or type p. If it is determined during step 2315 that the corresponding entry is type c, then a constant is written into the LUT during step 2320, and the bin pointer 2220 is incremented during step 2325. Program control returns to step 2315.

If, however, it is determined during step 2315 that the corresponding entry is type p, then a variable init_bp is initialized to the current value of the bin pointer 2220 during step 2330. A variable value is then set during step 2335 to the sign indicated in the entry in the types table 2250 pointed to by the bin pointer 2220, multiplied by the bin count value in the entry in the bin table 2210 pointed to by the bin pointer 2220. The bin pointer 2220 is then replaced during step 2340 with the value of the pointer table 2230 at the address pointed to by the bin pointer 2220.

A test is performed during step 2345 to determine if the bin pointer 2220 equals the variable init_bp. If it is determined during step 2345 that the bin pointer 2220 does not equal the variable init_bp, then program control returns to step 2335.

If, however, it is determined during step 2345 that the bin pointer 2220 does equal the variable init_bp, then the LLR value associated with the bin pointer 2220 is computed during step 2350, the new LLR value is written into the LUT during step 2355 and the bin pointer 2220 is incremented during step 2360. Program control then returns to step 2315.

It is noted that using a linked list results in a general solution where the number of terms in the expression is arbitrary (e.g., it is not limited to just two bin values).

CONCLUSION

In one or more embodiments of the disclosure, techniques are provided for read parameter prediction. It should be understood that the read parameter prediction techniques illustrated in FIGS. 1 through 23 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements. For example, one or more embodiments provide a significantly improved codeword failure rate without increasing latency or complexity.

It is to be appreciated that the particular advantages described above and elsewhere herein are associated with particular illustrative embodiments and need not be present in other embodiments. Also, the particular types of read parameter prediction features and functionality as illustrated in the drawings and described above are exemplary only, and numerous other arrangements may be used in other embodiments.

As mentioned previously, at least portions of the disclosed read parameter prediction system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

The disclosed read parameter prediction arrangements may be implemented using one or more processing platforms. One or more of the processing modules or other components may therefore each run on a computer, storage device or other processing platform element. A given such element may be viewed as an example of what is more generally referred to herein as a "processing device."

Figure 24:
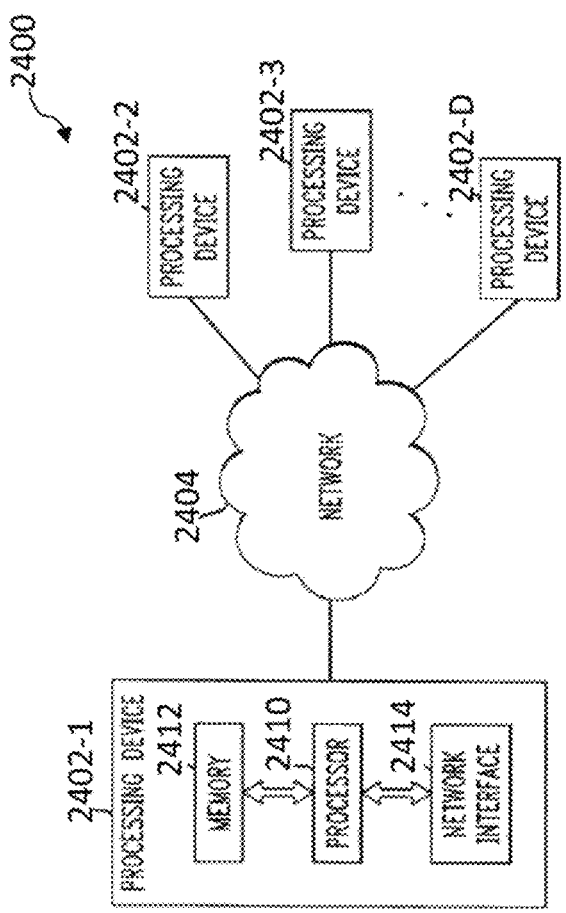
FIG. 24 illustrates a processing platform that may be used to implement at least a portion of one or more embodiments of the disclosure.

Referring now to FIG. 24, one possible processing platform that may be used to implement at least a portion of one or more embodiments of the disclosure is shown. The processing platform 2400 in this embodiment comprises at least a portion of the given system and includes at least one processing device(s), denoted 2402-1, 2402-2, 2402-3, . . . 2402-D, which communicate with one another over a network 2404. The network 2404 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 2402-1 in the processing platform 2400 comprises a processor 2410 coupled to a memory 2412. The processor 2410 may comprise a microprocessor, a microcontroller, an application specific integrated circuit (ASIC), a field programmable gate array (FPGA) or other type of processing circuitry, as well as portions or combinations of such circuitry elements. The memory 2412 may comprise random access memory (RAM), read only memory (ROM) or other types of memory, in any combination. The memory 2412 and other memories disclosed herein should be viewed as illustrative examples of what are more generally referred to as "processor-readable storage media" storing executable program code of one or more software programs.

Also included in the processing device 2402-1 is network interface circuitry 2414, which is used to interface the processing device with the network 2404 and other system components, and may comprise conventional transceivers.

The other processing devices 2402, if any, of the processing platform 2400 are assumed to be configured in a manner similar to that shown for processing device 2402-1 in the figure.

Again, the particular processing platform 2400 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 24, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 2400 shown in FIG. 24 is presented by way of example only, and the read parameter prediction system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the read parameter prediction system. Such components can communicate with other elements of the read parameter prediction system over any type of network or other communication media.

As indicated previously, components of an information processing system as disclosed herein can be implemented at least in part in the form of one or more software programs stored in memory and executed by a processor of a processing device. For example, at least portions of the functionality of the processes of FIGS. 9, 10, 17, 18A, 18B and/or 23 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and read parameter prediction systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:
1. A method, comprising:
  determining a correlation between log likelihood ratio (LLR) values and signal count metrics associated with different pages types of a first memory of a solid-state storage device, the correlation based on linear fitted curves to difference values of signal count metrics;

storing a plurality of parameters defining the determined correlation in a second memory of the storage device associated with each of the different page types;

in response to a decoding failure of a codeword read from the first memory of the solid-state storage device, obtaining at least three read values of the codeword;

calculating a difference value between signal count metrics from the at least three reads;

retrieving the plurality of parameters defining the correlation for the page type of the first memory where the codeword is stored;

calculating a plurality of dynamic LLR values based on the difference value and the correlation; and decoding the codeword following the decoding failure based at least in part upon the calculated plurality of dynamic LLR values.

2. The method of claim 1, wherein at least two of the at least three read values are obtained from the first memory following the decoding failure.

3. The method of claim 1, wherein the signal count metrics are each associated with one of a plurality of regions defined by a plurality of read threshold voltages of memory cells of the first memory, and wherein the LLR values indicate a confidence level of prediction of threshold voltage for any particular memory cell falling in the plurality of regions.

4. The method of claim 3, wherein the plurality of regions comprise at least two regions adjacent to a first read threshold voltage and wherein one or more of the plurality of regions are differentiated using one or more additional read operations.

5. A non-transitory machine-readable recordable storage medium, wherein one or more software programs when executed by one or more processing devices implement the steps of the method of claim 1.

6. An apparatus, comprising:
a first memory;
a second memory storing a plurality of parameters defining a predetermined correlation between LLR values and signal count metrics for each page type of the first memory, the predetermined correlations based on linear fitted curves to difference values of signal count metrics; and
at least one processing device, coupled to the first memory and the second memory, operative to implement the following steps:
in response to a decoding failure of a codeword read from the memory, obtaining at least three read values of the codeword,
calculating a difference value between signal count metrics from the at least three reads,
retrieving from the second memory the plurality of parameters defining the predetermined correlation associated with the page type of the first memory where the codeword is stored,
calculating a plurality of dynamic log likelihood ratio (LLR) values based on the difference value and the predetermined correlation, and
decoding the codeword following the decoding failure based at least in part upon the calculated plurality of dynamic LLR values.

7. The apparatus of claim 6, wherein at least two of the at least three read values are obtained from the first memory following the decoding failure.

8. The apparatus of claim 6, wherein the signal count metrics are each associated with one of a plurality of regions defined by a plurality of read threshold voltages of memory cells of the first memory, the plurality of regions comprising at least two regions adjacent to a first read threshold voltage, and wherein one or more of the plurality of regions are differentiated using one or more additional read operations.

9. The apparatus of claim 6, wherein at least a portion of the steps of calculating and determining is performed using one or more of a hardware acceleration block, firmware, a state machine and hardware.

10. A storage controller comprising the apparatus of claim 6.

11. A storage device comprising a controller coupled to a solid state storage media, the controller configured to perform the following steps:
in response to a decoding failure of a codeword of the storage media, obtaining at least three read values of the codeword;
calculating a difference value between signal count metrics from the at least three reads;
retrieving from a second memory of the storage device a plurality of parameters defining a predetermined correlation between LLR values and signal count metrics associated with a page type of the storage media where the codeword is stored, the predetermined correlation based on linear fitted curves to difference values of the signal count metrics;
calculating a plurality of dynamic log likelihood ratio (LLR) values based on the difference value and the predetermined correlation; and
decoding the codeword following the decoding failure based at least in part upon the calculated plurality of dynamic LLR values.

* * * * *